(12) United States Patent
Kondo et al.

(10) Patent No.: US 8,971,008 B2
(45) Date of Patent: Mar. 3, 2015

(54) ELECTROSTATIC CHUCK

(75) Inventors: Shunpei Kondo, Fukuoka-ken (JP); Hiroki Matsui, Fukuoka-ken (JP)

(73) Assignee: Toto Ltd., Fukuoka (JP)

( * ) Notice: Subject to any disclaimer, the term of this patent is extended or adjusted under 35 U.S.C. 154(b) by 372 days.

(21) Appl. No.: 13/428,527

(22) Filed: Mar. 23, 2012

(65) Prior Publication Data
US 2012/0248715 A1 Oct. 4, 2012

(30) Foreign Application Priority Data

Mar. 30, 2011 (JP) ................................ 2011-076775

(51) Int. Cl.
*H01L 21/67* (2006.01)
*H01L 21/683* (2006.01)

(52) U.S. Cl.
CPC .................................. *H01L 21/6833* (2013.01)
USPC ............................ 361/234; 361/231; 361/233

(58) Field of Classification Search
CPC ........ H01L 21/67; H01L 21/683; H02N 13/00
USPC ........................................ 361/234, 231, 233
See application file for complete search history.

(56) References Cited

U.S. PATENT DOCUMENTS

| 8,519,728 B2 * | 8/2013 | Yalei et al. ............... 324/758.01 |
| 2004/0240142 A1 | 12/2004 | Fujii et al. |
| 2007/0223167 A1 | 9/2007 | Hattori et al. |
| 2010/0065300 A1 * | 3/2010 | Miyashita et al. ........ 174/110 R |

FOREIGN PATENT DOCUMENTS

| JP | 10-189696 A | 7/1998 |
| JP | 2004-273736 A | 9/2004 |
| JP | 2007-005740 A | 1/2007 |
| JP | 2007-258610 A | 10/2007 |
| KR | 10-2009-0110999 A | 10/2009 |
| WO | 2008/035395 A1 | 3/2008 |

* cited by examiner

*Primary Examiner* — Zeev V Kitov
(74) *Attorney, Agent, or Firm* — Carrier Blackman & Associates, P.C.; Joseph P. Carrier; Anne G. Sabourin

(57) ABSTRACT

According to one embodiment, an electrostatic chuck includes: a ceramic dielectric substrate, an electrode, and a conductive member. The ceramic dielectric substrate has a first major surface on which a material to be adsorbed is to be mounted and a second major surface on a side opposite the first major surface. The electrode is interposed between the first major surface and the second major surface of the ceramic dielectric substrate. The conductive member is provided in a recess formed in the second major surface of the ceramic dielectric substrate. A tip end of the recess has a curved surface.

6 Claims, 19 Drawing Sheets

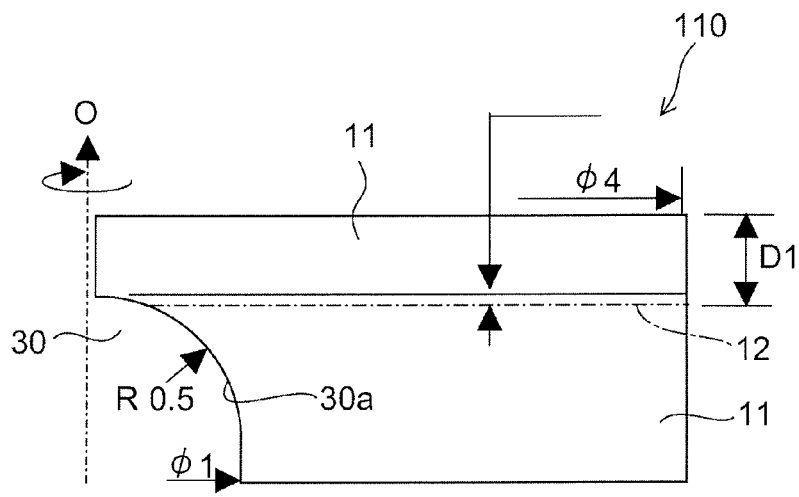
FIG. 8A
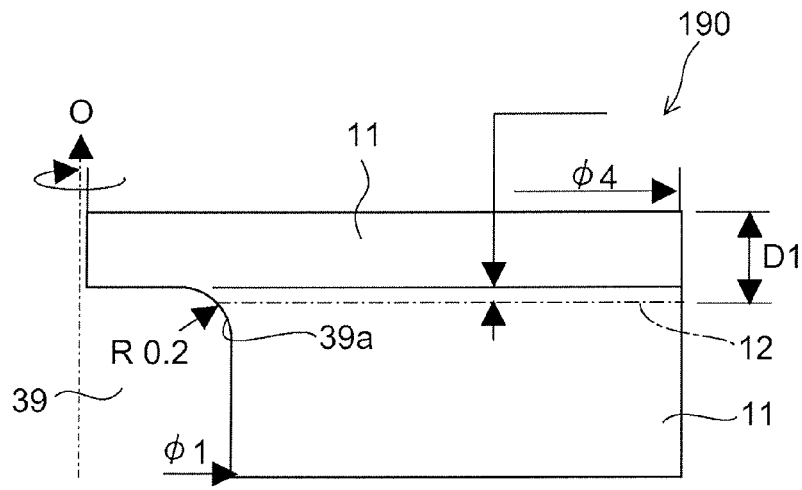
FIG. 8B
| D3 [mm] | Maximum stress [MPa] | |
| --- | --- | --- |
| | 110 | 190 |
| 0.000 | 0.089 | 0.247 |
| 0.075 | 0.108 | 0.324 |
| 0.150 | 0.147 | 0.524 |
FIG. 9

US 8,971,008 B2

ELECTROSTATIC CHUCK

CROSS-REFERENCE TO RELATED APPLICATIONS

This application is based upon and claims the benefit of priority from the prior Japanese Patent Application No.2011-076775, filed on Mar. 30, 2011; the entire contents of which are incorporated herein by reference.

FIELD

Embodiments described herein relate generally to an electrostatic chuck.

BACKGROUND

Electrostatic chucks of sintered ceramic, which are made by interposing an electrode between ceramic substrates of alumina or the like and sintering the arrangement, apply an electrostatic adsorption-use power to the internal electrode and thereby adsorb a substrate such as a silicon wafer or the like by an electrostatic force. To supply the electrostatic adsorption-use power to the internal electrode, electrostatic chucks of this type include an implemented arrangement in which a portion of a conductor in continuity with the electrode is exposed at a face on a side opposite the electrostatic adsorption face of the ceramic substrate, and a power supply-use connector is joined to the electrode, and the like.

In Patent Document 1, for a portion to connect an electrode built into a ceramic substrate with external wiring for supplying the electrostatic adsorption-use power, a hole having a bottom face at the same face as a formed face of the electrode is formed in the substrate, and a bottom face portion joining material is joined from the bottom face of the hole to the exposed electrode.

In Patent Document 1, a technique is disclosed for an electrostatic chuck made of sintered ceramics using a sintering process in which the electrode is interposed between ceramic substrates. In the technique, an opening is provided in the substrate after the ceramic sintering process, which includes Hot Isostatic Press (HIP) processing, and, at the opening, the electrode is joined to bottom face portion joining material. As methods to provide the opening in the substrate, processes such as cutting and grinding using diamond tools, laser machining, ultrasonic machining, and sandblasting are used.

Further, Patent Document 2 discloses a technique whereby a fixed hole, piercing the internal electrode, is provided in the sintered ceramic substrate, and a metalized layer is formed on the internal walls of the fixed hole.

Here, a thickness of the built-in electrode should generally be not more than 20 micrometers (μm). However, an accuracy of a machining position of the cutting process using the diamond tool is not less than 10 μm. Hence, there are cases in which a bottom of the hole opened in the cutting process does not reach the internal electrode, and cases in which an opening is formed to a greater extent than necessary by piercing through the internal electrode. In the case in which a hole piercing through the internal electrode is formed, an insulating layer between a bottom face of the hole piercing through the internal electrode and a material to be adsorbed gets thinner, resulting in the risk of a drop in reliability with regard to mechanical strength and/or electrical insulation.

SUMMARY

According to one embodiment, an electrostatic chuck includes: a ceramic dielectric substrate, an electrode, and a conductive member. The ceramic dielectric substrate has a first major surface on which a material to be adsorbed is to be mounted and a second major surface on a side opposite the first major surface. The electrode is interposed between the first major surface and the second major surface of the ceramic dielectric substrate. The conductive member is provided in a recess formed in the second major surface of the ceramic dielectric substrate. A tip end of the recess has a curved surface.

BRIEF DESCRIPTION OF THE DRAWINGS

FIGS. 8A and 8B are schematic views illustrating forms of the recess in the embodiment and Reference Example;

FIG. 9 shows simulation results from a simulation of the maximum stress on the ceramic dielectric substrates;

DETAILED DESCRIPTION

Figure 1:
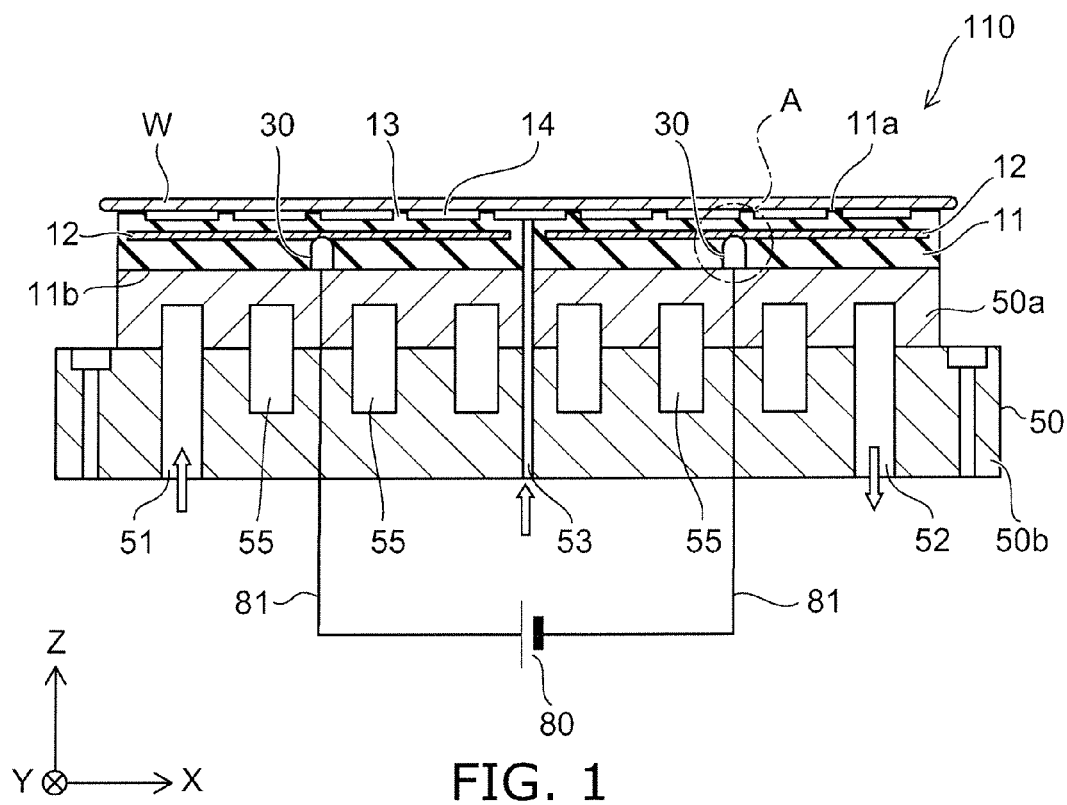
FIG. 1 is a schematic cross-sectional view illustrating the configuration of an electrostatic chuck according to an embodiment.

A first invention is an electrostatic chuck that includes: a ceramic dielectric substrate having a first major surface on which a material to be adsorbed is to be mounted and a second major surface on a side opposite the first major surface; an electrode interposed between the first major surface and the second major surface of the ceramic dielectric substrate; and a conductive member provided in a recess formed in the second major surface of the ceramic dielectric substrate, wherein a tip end of the recess has a curved surface, the electrode has an exposed portion at the curved surface, and the conductive member contacts the electrode at the exposed portion.

According to the above-described electrostatic chuck, reliable electrical conduction can be achieved between the electrode and the conductive member without boring the recess too deep toward the first major surface side. Hence, it is possible to prevent excessively deep boring into the ceramic dielectric substrate, and thus to guarantee, to a sufficient extent, reliability in the ceramic dielectric substrate with regard to mechanical strength and electrical insulation.

A second invention is the electrostatic chuck of the first invention, wherein the curved surface is spherical, and, if the exposed portion has a diameter of L when viewed along a first direction going from the second major surface toward the first major surface and a curvature radius of the curved surface is R, $L \leq 2R$.

According to the above-described electrostatic chuck, the recess does not protrude beyond the curvature radius R at any point going from the exposed portion toward the first major surface, thus making it possible to guarantee, to a sufficient extent, reliability in the ceramic dielectric substrate with regard to mechanical strength and electrical insulation.

A third invention is electrostatic chuck of the first invention, wherein if the exposed portion has a diameter of L when viewed along a first direction going from the second major surface toward the first major surface, and a gap in the first direction between a second major surface side of the exposed portion and a tip end of the recess is D3, $D3 \leq L/2$.

According to the above-described electrostatic chuck, the recess does not protrude beyond L/2 going from the exposed portion toward the first major surface side, thus making it possible to guarantee, to a sufficient extent, reliability in the ceramic dielectric substrate with regard to mechanical strength and electrical insulation.

A fourth invention is the electrostatic chuck of the first invention, wherein if the curved surface is spherical and has a curvature radius of R and a gap in a first direction, going from the second major surface toward the first major surface between a second major surface side of the exposed portion and a tip end of the recess is D3, $D3 \leq R - (R/\sqrt{2})$.

According to the above-described electrostatic chuck, the recess does not protrude beyond $R-(R/\sqrt{2})$ going from the exposed portion toward the first major surface side, thus making it possible to guarantee, to a sufficient extent, reliability in the ceramic dielectric substrate with regard to mechanical strength and electrical insulation. Further, when forming the recess, an amount of increase in the distance D3 with respect to an amount of increase in the diameter L of the exposed portion, when viewed in the first direction, is reduced, thus making it possible to suppress excess boring.

A fifth invention is the electrostatic chuck of the first invention, wherein a direction perpendicular to the first direction that goes from the second major surface toward the first major surface is a second direction, and a direction perpendicular to the first direction and the second direction is a third direction, and when, in a cross-section of the recess viewed along the second direction, an angle, with respect to the third direction, of a tangent to the curved surface at a contact point between a profile line of the curved surface and the exposed portion is θ, θ<45°.

According to the electrostatic chuck, excessive boring of the recess can be suppressed when forming the recess. In particular, if θ<45°, when forming the recess, an amount of increase in the distance D3 with respect to an amount of increase in the diameter L of the exposed portion, when viewed in the first direction, is reduced, thus making it possible to suppress excess boring into the ceramic dielectric and to guarantee, to a sufficient extent, reliability in the ceramic dielectric substrate with regard to mechanical strength and electrical insulation.

A sixth invention is the electrostatic chuck of the first invention, wherein the recess includes a first portion provided on the second major surface side, and a second portion provided between the first portion and the electrode and having an opening smaller than the first portion.

According to the electrostatic chuck, the separation of the second portion for obtaining electrical conduction with the electrode and the first portion for obtaining electrical conduction with external portions means that there is no need for the second portion, which is for obtaining electrical conduction with the electrode, to contact external wiring, and it is therefore possible to suppress damage to the second portion.

A seventh invention is the electrostatic chuck of the sixth invention, wherein the recess includes a plurality of the second portions between the first portion and the electrode.

According to the electrostatic chuck, the electrical conduction with the electrode can be made more reliably.

Embodiments of the invention will now be described with reference to the drawings. Note that the same numerals are applied to similar constituent elements in the drawings and detailed descriptions of such constituent elements are appropriately omitted.

FIG. 1 is a schematic cross-sectional view illustrating the configuration of an electrostatic chuck according to the embodiment.

Figure 2:
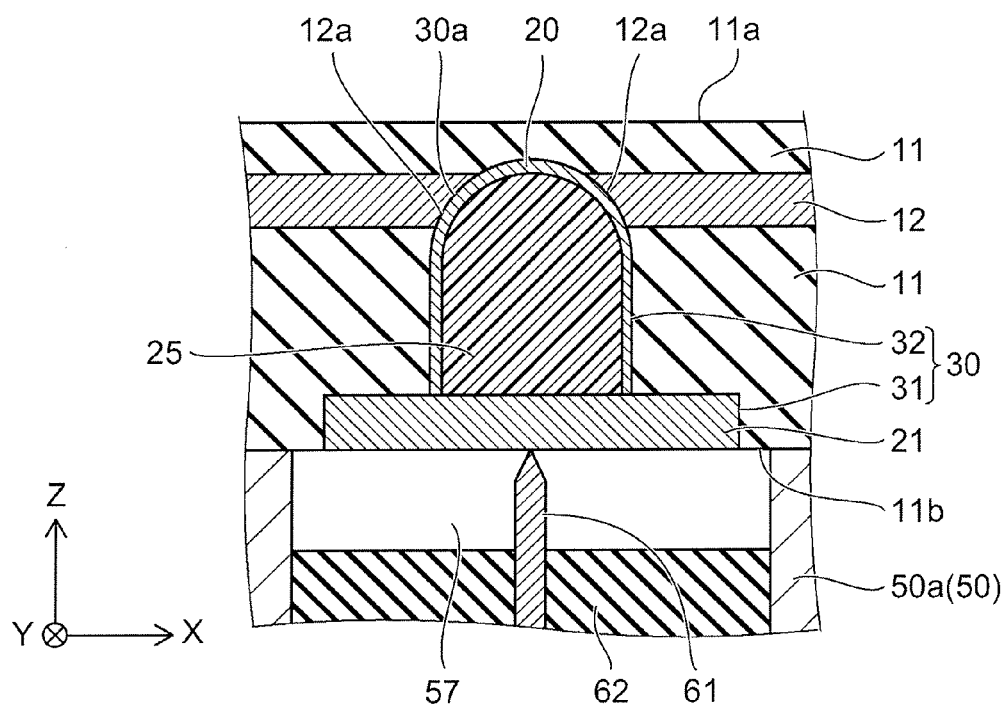
FIG. 2 is a schematic magnified cross-sectional view of portion A illustrated in FIG. 1.

FIG. 2 is a schematic magnified cross-sectional view of portion A illustrated in FIG. 1.

An electrostatic chuck 110 according to the embodiment includes a ceramic dielectric substrate 11, an electrode 12, and a conductive member 20.

Specifically, the ceramic dielectric substrate 11 is, for example, a flat plate-like substrate made of a sintered ceramic, and includes a first major surface 11a on which a material to be adsorbed W, such as a semiconductor substrate, is mounted and a second major surface 11b on a side opposite the first major surface 11a. The electrode 12 is interposed between the first major surface 11a and the second major surface 11b of the ceramic dielectric substrate 11. In other words, the electrode 12 is formed so as to be inserted within the ceramic dielectric substrate 11. The electrostatic chuck 110 applies an adsorb and hold voltage 80 to the electrode 12, thereby generating charge on the first major surface 11a side of the electrode 12 and using a resulting electrostatic force to adsorb and hold the adhering target W.

The electrode 12 is provided in a thin film form along the first major surface 11a and the second major surface 11b of the ceramic dielectric substrate 11. The electrode 12 may be a unipolar type or a bipolar type. The electrode 12 illustrated in FIG. 1 is of the bipolar type, having two poles in the same plane.

In the ceramic dielectric substrate 11, a recess 30 is provided in a direction going from the second major surface 11b toward the first major surface 11a and reaching as far as the electrode 12.

In the description of the embodiment, a direction going from the second major surface 11b toward the first major surface 11a (first direction) is denoted as a Z direction, one of the directions perpendicular to the Z direction (second direction) is denoted as a Y direction, and the direction perpendicular to the Z direction and the Y direction (third direction) is denoted as an X direction.

At a tip end of the recess 30, a curved surface 30a is provided. Here, the curved surface 30a is inclined with respect to an axis that extends in the Z direction and curves around the Z axis. The curved surface 30a illustrated in FIG. 2 is a spherical surface portion provided at the tip end side (Z direction side) of the recess 30.

The electrode 12 built into the ceramic dielectric substrate 11 includes an exposed portion 12a that is exposed at the curved surface 30a of the recess 30. Thus, the portion of the curved surface 30a provided at the tip end side of the recess 30 reaches as far as the electrode 12 and a portion of the electrode 12 is in an exposed state at the curved surface 30a.

The conductive member 20 contacts the exposed portion 12a of the electrode 12 at the curved surface 30a of the recess 30. As a result, the conductive member 20 is in a state of electrical conduction with the electrode 12. By providing the recess 30 having the curved surface 30a in this way, deep boring of the hole provided in the ceramic dielectric substrate 11 to obtain conduction between the electrode 12 and the conductive member 20 is suppressed, thus preventing a drop in mechanical strength and a drop in reliability of the electrical insulation.

As illustrated in FIG. 1, the electrostatic chuck 110 is attached to a baseplate 50. The baseplate 50 is a reference for attaching the electrostatic chuck 110. To attach the electrostatic chuck 110 to the baseplate 50, a heat-resistant resin such as silicon, indium bonding, brazing, or the like is suitably selected on the basis of usage temperature band, cost and the like.

The baseplate 50 is, for example, divided into an upper portion 50a and a lower portion 50b made of aluminum. A communication path 55 is provided between the upper portion 50a and the lower portion 50b. The communication path 55 has one end connected to an input path 51 and the other end connected to an output path 52.

The baseplate 50 has the role of adjusting the temperature of the electrostatic chuck 110. For example, when the electrostatic chuck 110 is cooled, a cooling medium is caused to flow from the input path 51, pass through the communication path 55, and flow out from the output path 52. Accordingly, heat from the baseplate 50 is absorbed by the cooling medium, and the electrostatic chuck 110 attached to the baseplate 50 can be cooled. On the other hand, when the electrostatic chuck 110 is to retain heat, a heat-retaining medium can be supplied to the communication path 55. Alternatively, a heating element can be included in the electrostatic chuck 110 and the baseplate 50. When the temperature of the electrostatic chuck 110 is adjusted via the baseplate 50, the temperature of the adhering target W adsorbed and held by the electrostatic chuck 110 can be adjusted.

On the first major surface 11a side of the ceramic dielectric substrate 11, dots 13 are provided as required, and grooves 14 are provided between the dots 13. The grooves 14 are in communication, and spaces are formed between a back face of the adhering target W mounted on the electrostatic chuck 110 and the grooves 14. The grooves 14 are connected to introduction paths 53 which pierce through the baseplate 50 and the ceramic dielectric substrate 11. When a transfer gas such as He or the like is introduced from the introduction paths 53 with the adhering target W in a state of being adsorbed and held, the transfer gas flows into a space provided between the adhering target W and the grooves 14, and the adhering target W can be directly cooled by the transfer gas.

Here, by appropriately selecting a height of the dots 13 (depth of the grooves 14), an area ratio of the dots 13 and the grooves 14, and shapes thereof, a temperature of the adhering target W and particles adhering to the adhering target W can be controlled to a preferable state.

Next, the inside of the recess 30 will be described in detail. As illustrated in FIG. 2, the recess 30 includes, for example, a first portion 31 and a second portion 32 having a smaller opening than the first portion. The first portion 31 is provided on the second major surface 11b side of the ceramic dielectric substrate 11. Further, the second portion 32 is provided between the first portion 31 and the electrode 12.

At the tip end side of the second portion 32, the curved surface 30a is provided. The portion of the curved surface 30a reaches as far as the electrode 12 and a portion of the electrode 12 is exposed at the curved surface 30a (exposed portion 12a). The conductive member 20 is formed in the recess 30 and contacts the exposed portion 12a of the electrode 12. The conductive member 20 illustrated in FIG. 2 is formed over an entire internal wall of the recess 30. Note that the conductive member 20 is not necessarily formed over the entire internal wall of the recess 30. Provided that there is electrical conduction with the electrode 12, the conductive member 20 may be formed over only a portion of the internal wall.

For the electrode 12, palladium or the like is used. For the conductive member 20, platinum or the like is used. A conductive resin 25 may, for example, be embedded in the recess 30. The conductive resin 25 is bonded to a pad 21 provided on the second major surface 11b side of the recess 30. Consequently, the pad 21 is in a state of electrical conduction with the electrode 12 via the conductive resin 25 and the conductive member 20 within the recess 30.

The pad 21 is, for example, provided within the first portion 31 and exposed on the second major surface 11b side of the ceramic dielectric substrate 11. Dividing the recess 30 into the first portion 31 and the second portion 32 means that there is no need to cause a later-described contact electrode 61 to contact the second portion 32 in order to obtain electrical conduction with the electrode 12, and hence, damage to the second portion 32 can be suppressed.

The contact electrode 61 is provided in an upper portion 50a of the baseplate 50 in a position corresponding to the pad 21. A hole 57 is provided in the upper portion 50a of the baseplate 50, and the contact electrode 61, which is held by an insulating material 62, is fitted in the hole 57. Hence, when the electrostatic chuck 110 is attached to the upper portion 50a of the baseplate 50, the contact electrode 61 contacts the pad 21 and electrical conduction can thereby be obtained.

For the contact electrode 61, a moveable probe may, for example, be used. Accordingly, a reliable connection is obtained between the contact electrode 61 and the pad 21, and damage to the pad 21 caused by the contact of the contact electrode 61 is minimized. Note that the contact electrode 61 is not limited to that described above, and may take any form. For example the contact electrode 61 may simply contact the pad 21 or engage with or be screwed into the pad 21.

Next, the relationship between the recess 30 and the exposed portion 12a is described.

Figure 3A:
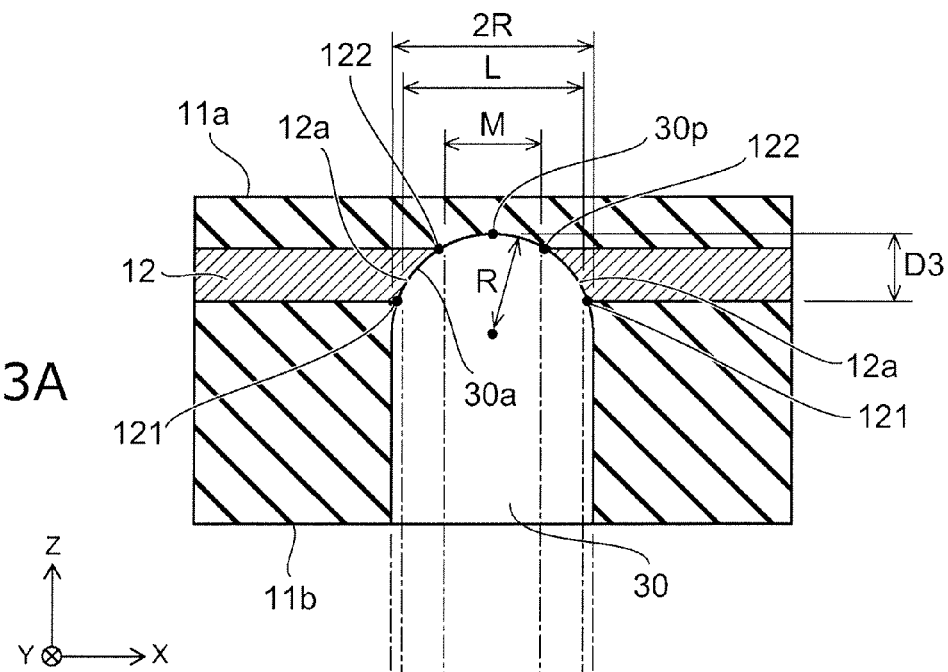
FIGS. 3A and 3B are a schematic views illustrating a state of exposed portions of the recess and the electrode.
Figure 3B:
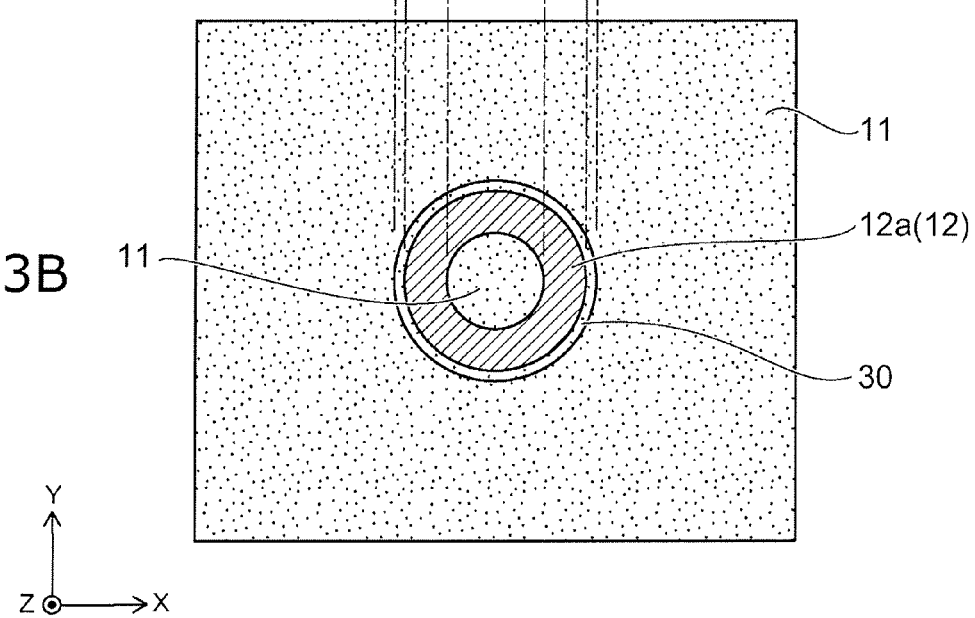

FIGS. 3A and 3B are a schematic views illustrating a state of exposed portions of the recess and the electrode.

FIG. 3A is a schematic cross-sectional view, and FIG. 3B is a schematic plan view, looking along the Z direction from the second major surface in FIG. 3A.

The recess 30 is provided to have a cylindrical form along the Z direction and the curved surface 30a at a tip end side. In the recess 30 illustrated in FIG. 3, the spherical curved surface 30a is provided at the tip end side. Here, if a curvature radius of the spherical curved surface 30a in the cross-section viewed along the Y direction is denoted R, the diameter of the recess 30 is 2R.

If a portion of the curved surface 30a of the recess 30 reaches the electrode 12, a portion of the electrode 12 is removed. The exposed portion 12a of the electrode 12, which is exposed at the curved surface 30a, appears along the curved surface 30a. As illustrated in FIG. 3B, when the inside of the recess 30 is viewed along the Z direction from the second major surface 11b, the exposed portion 12a appears along the curved surface 30a as a circle. Here, when the tip end of the recess 30 pierces through the electrode 12, the ceramic dielectric substrate 11 is exposed at the pierced portion. In this case, as illustrated in FIG. 3B, the ceramic dielectric substrate 11 appears in a central portion of the exposed portion 12a which appears as a circle. In other words, the exposed portion 12a appears to have a ring-form.

In the embodiment, for the electrode 12 exposed at the curved surface 30a of the recess 30, a diameter at a position 121 closest to the second major surface 11b side is denoted L, and a diameter at a position 122 closest to the first major surface 11a side is denoted M. Further, a distance from the second major surface 11b side of the electrode 12 to a tip 30p of the recess 30 in the Z direction is denoted D3. The distance D3 is a reference for depth when boring the recess 30.

Figure 4:
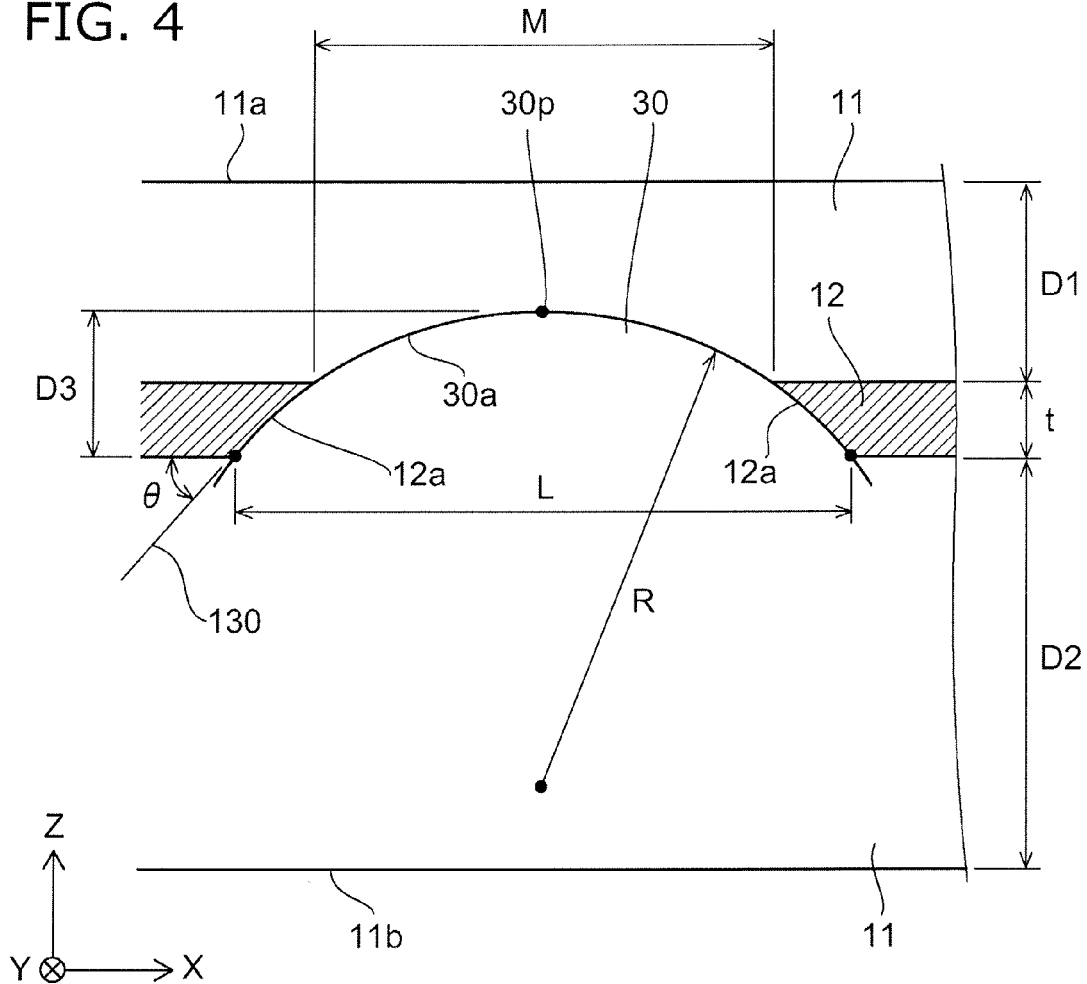
FIG. 4 is a schematic view illustrating dimensions of the electrode and other portions formed as a result of the recess.

FIG. 4 is a schematic view illustrating dimensions of the electrode and other portions formed as a result of the recess.

Besides the above-described curvature radius R, diameters L and M of the exposed portion 12a and distance D3, a thickness of the electrode 12 is denoted t, and, within the thickness of the ceramic dielectric substrate 11, a thickness from the electrode 12 to the first major surface side is denoted D1 and a thickness from the electrode 12 to the second major surface side is denoted D2. In the cross-sectional form of the curved surface 30a viewed in the Y direction, an angle between a tangent 130 at the position 121 of the exposed portion 12a closest to the second major surface 11b side and the second major surface 11b side of the electrode 12 is denoted θ. With dimensions denoted as described, the recess 30 of the embodiment is formed so as to satisfy at least one of (1) L≤2R, (2) D3≤L/2, (3) D3≤R−(R/√2), and (4) θ<45°. As a consequence, deep boring of the recess 30 can be prevented.

When the above-described condition (1) is satisfied, the recess 30 does not protrude beyond the curvature radius R going from the position 121 of the exposed portion 12a toward the first major surface 11a side, thus making it possible to guarantee, to a sufficient extent, reliability in the ceramic dielectric substrate 11 with regard to mechanical strength and electrical insulation.

When the above-described condition (2) is satisfied, the recess 30 does not protrude beyond L/2 going from the position 121 of the exposed portion 12a toward the first major surface 11a side, thus making it possible to guarantee, to a sufficient extent, reliability in the ceramic dielectric substrate 11 with regard to mechanical strength and electrical insulation.

When the above-described condition (3) is satisfied, the recess 30 does not protrude beyond R−R/√2) going from the position 121 of the exposed portion 12a toward the first major surface 11a side, thus making it possible to guarantee, to a sufficient extent, reliability in the ceramic dielectric substrate 30 with regard to mechanical strength and electrical insulation. Further, when forming the recess 30, an amount of increase in the distance D3 with respect to an amount of increase in the diameter L is reduced. It is then easier to manage the distance D3 using the diameter L, and excessively deep boring can be effectively suppressed.

When the above-described condition (4) is satisfied, excessively deep boring can be suppressed when forming the recess 30. It is thus possible to suppress excess boring into the ceramic dielectric substrate 11 and to guarantee, to a sufficient extent, reliability in the ceramic dielectric substrate 11 with regard to mechanical strength and electrical insulation.

Further, if θ<45°, when forming the recess 30, an amount of increase in the distance D3 with respect to an amount of increase in the diameter L is reduced. It is then easier to manage the distance D3 using the diameter L, and excessive deep boring can be effectively suppressed. A value of θ is preferably not more than 30°, more preferably not more than 20°, and even more preferably not more than 15°.

For example, the thickness D1 may be from 0.05 millimeters (mm) to 0.5 mm. The thickness D2 is thicker than the thickness D1 and may take a value of, for example, 0.7 mm. Further, the distance D3 is, for example, not more than ⅕ of the thickness D1, is more preferably not more than ¹⁄₁₀ of the thickness D1 and is even more preferably not more than ¹⁄₂₀ of the thickness D1. Further, the thickness t is 0.001 mm to 0.02 mm, the curvature radius R is, for example, 0.25 mm to 1 mm and preferably 0.45 mm.

Here, the diameter L of the exposed portion 12a of the electrode 12 varies in a fixed relation with respect to the distance D3, which is the reference for the depth of the recess 30.

For example, with the above-described dimensions and when the thickness t is sufficiently thin, the Formula 1 below is established.

$$D3 = R - \tfrac{1}{2} \times \sqrt{(4 \times R^2 - L^2)}$$ (Formula 1)

Figure 5:
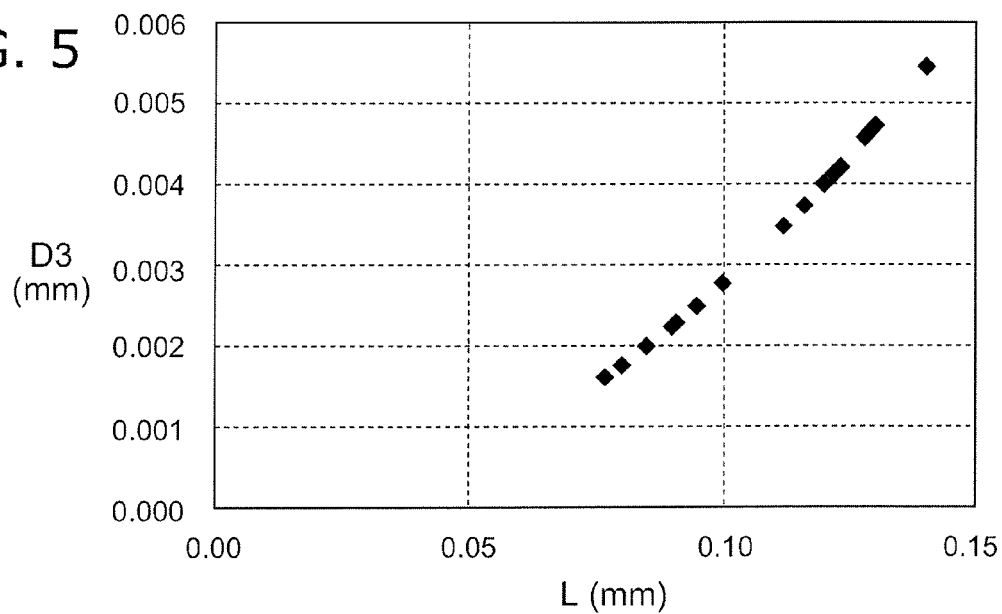
FIG. 5 shows the relationship between the diameter L and the distance D3.

FIG. 5 shows the relationship between the diameter L and the distance D3 when R is set to 0.45 mm.

The relationship between the diameter L and the distance D3 shown in FIG. 5 is one in which the above-described condition (3) is satisfied. Thus, the diameter L and the distance D3 follow the relationship of Formula 1. Hence, when boring the recess 30, the distance D3 is controlled by the diameter L.

Further, when the condition of the above-described (3) is satisfied, an amount of change in the distance D3 with respect to an amount of change in the diameter L is reduced. Hence, by controlling the change in the diameter L, the distance D3 can be finely controlled and it is therefore easy to control the microscopic distance D3.

FIGS. 6A to 6D are schematic views illustrating differences in the contact state with the electrode according to differences in curvature radius.

In FIG. 6, recesses 30 in the electrostatic chuck 110 according to the embodiment and recesses 39 in an electrostatic chuck 190 according to a Reference Example are illustrated side by side. In FIGS. 6A to 6D, the recesses 30 and 39 are each provided to be deep. In FIGS. 6A to 6D, positions of the tip ends of the recesses 30 and 39 vary, going from P1 to P4. Whereas the recess 30 has a curved surface which is formed to be spherical, the recess 39 is formed substantially without a curved surface.

Figure 6A:
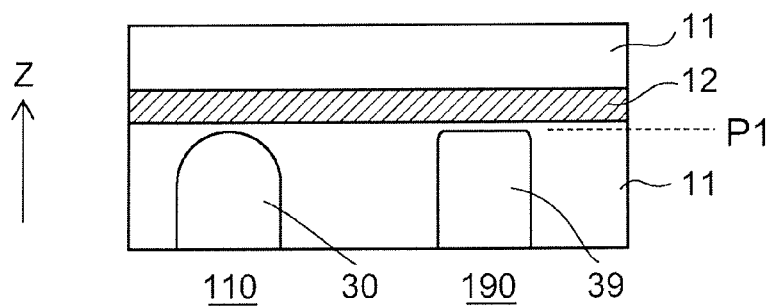
FIGS. 6A to 6D are schematic views illustrating differences in the contact state with the electrode according to differences in curvature radius.
Figure 6B:
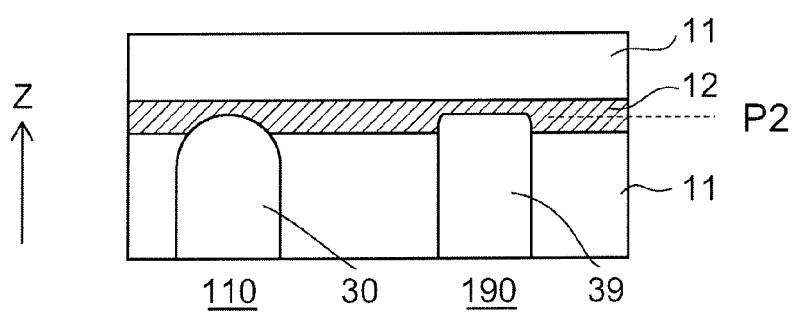
Figure 6C:
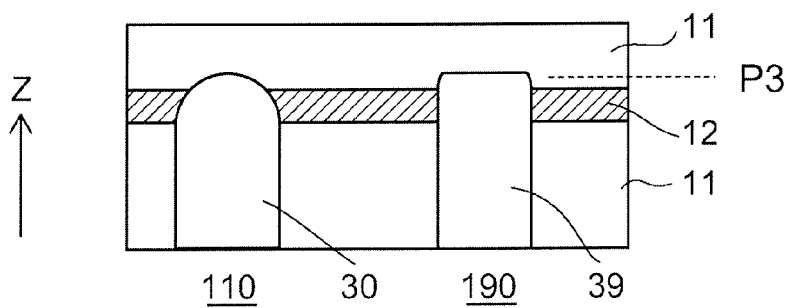
Figure 6D:
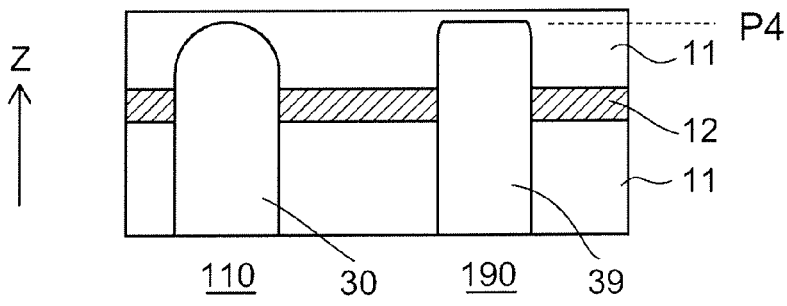

At a position P1 illustrated in FIG. 6A, the tip ends of the recesses 30 and 39 do not reach the electrode 12. At a position P2 illustrated in FIG. 6B, the tip ends of the recesses 30 and 39 reach within the electrode 12. At a position P3 illustrated in FIG. 6C, the tip ends of the recesses 30 and 39 pierce through the electrode 12 a small amount. At a position P4 illustrated in FIG. 6D, the tip ends of the recesses 30 and 39 fully pierce through the electrode 12a.

Figure 7A:
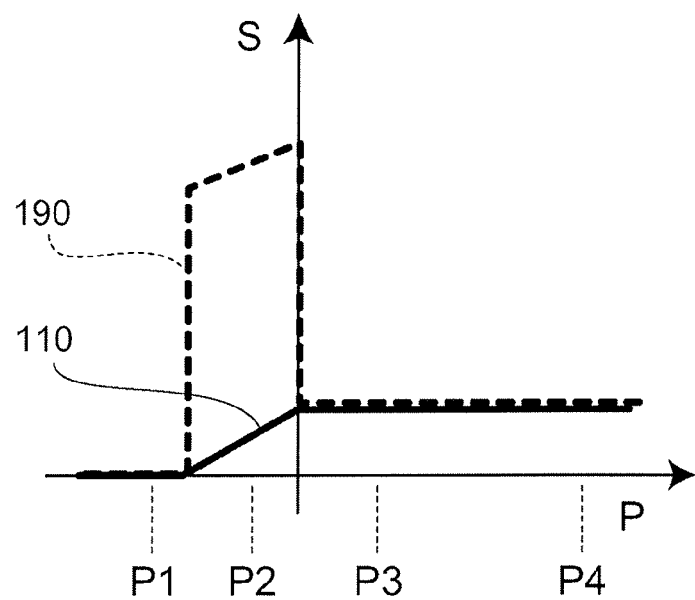
FIG. 7A and 7B are graphs showing variation in strength and an exposed area of the electrode with respect to the position of the tip end of the recess.
Figure 7B:
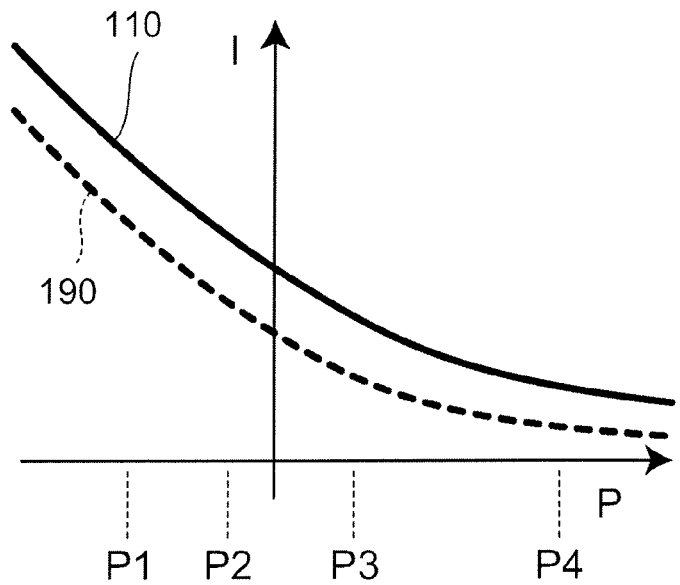

FIG. 7A and 7B are graphs showing variation in strength and an exposed area of the electrode with respect to the position of the tip end of the recess.

In FIG. 7, graphs for the electrostatic chuck 110 according to the embodiment and the electrostatic chuck 190 according to a Reference Example are shown. FIG. 7A shows variation in an exposed area S of the electrode with respect to a position P of the tip end of the recess. FIG. 7B shows variation in strength I of the ceramic dielectric substrate with respect to the position P of the tip end of the recess. The P1 to P4 shown in FIGS. 7A and 7B correspond to the positions of the tip ends of the recesses illustrated in FIGS. 6A to 6D.

First, the variation in the exposed area S is described based on FIG. 7A. When the position of the tip ends of the recesses 30 and 39 is P1, the recesses 30 and 39 do not reach the electrode 12, and so the exposed area S is 0 (zero). When the tip end position of the recesses 30 and 39 is P2 or higher, contact with the electrode 12 occurs. In the case of the recess 39 according to the Reference Example, the exposed area S increases steeply when the tip end position of the recesses 30 and 39 is within a range corresponding to the thickness of the electrode 12. However, in the case of the recess 30 according to the embodiment, the exposed area S increases gradually as a result of the curved surface 30a being formed at the tip end side.

When the recesses 30 and 39 become deeper still and the tip end position has pierced through the electrode 12 (from tip end position P3 onwards), the exposed area S becomes substantially constant. Thus, in the embodiment, in which the curved surface 30a is provided at the tip end side of the recess 30, the exposed area S increases gradually from the point where the recess 30 reaches the electrode 12 to the point where the recess has fully pierced through the electrode 12, and it is therefore easy to adjust the recess 30.

Next, the variation in the strength of the ceramic dielectric substrate will be described based on FIG. 7B. As the tip end position of the recesses 30 and 39 proceeds through P1 to P4, the strength of the ceramic dielectric substrate is reduced. The reason for this is that the deeper the recesses 30 and 39 are, the thickness of the remaining ceramic dielectric substrate is reduced, and strength is reduced accordingly. However, for a given tip end position of the recess, the strength of the ceramic dielectric substrate of the electrostatic chuck 110 according to the embodiment is higher than that of the electrostatic chuck 190 according to the Reference Example. This is the result of the provision of the spherical curved surface 30a at the tip end side of the recess 30.

Types of electrostatic chuck include a Coulomb type and a Johnsen-Rahbek type. The Coulomb-type electrostatic chuck excels at responsively attaching and detaching the adhering target over a wide temperature range. The Johnsen-Rahbek-type electrostatic chuck is characterized by stronger adsorption force to the adhering target than the Coulomb type. The electrostatic chuck 110 according to the embodiment is applicable to both the Coulomb type and the Johnsen-Rahbek type, but is particularly suited to the Coulomb type. Specifically, to increase the adsorption force in the Coulomb-type electrostatic chuck, it is necessary to reduce a thickness from the electrode 12 to the ceramic dielectric substrate 11 on the first major surface 11a side, and increase an adsorb and hold voltage 80 that is applied to the electrode 12. Now, in the electrostatic chuck 110 according to the embodiment, the reduction in strength caused by the hole with the form of the above-described recess 30 can be suppressed, and it is therefore possible to obtain sufficient mechanical strength of the ceramic dielectric substrate 11 even in the thin ceramic dielectric substrate 11 required for the Coulomb type.

FIGS. 8A to FIG. 9 are drawings illustrating differences in strength according to curvature of the recess.

FIGS. 8A and 8B are schematic views illustrating forms of the recess in the embodiment and the Reference Example. FIG. 9 shows simulation results from a simulation of the maximum stress on the ceramic dielectric substrates.

As illustrated in FIG. 8A, in the electrostatic chuck 110 according to the embodiment, the diameter of the recess 30 provided in the ceramic dielectric substrate 11 is 1 mm, the curvature radius of the curved surface 30a is 0.5 mm and the thickness D1 is 0.3 mm.

As illustrated in FIG. 8B, in the electrostatic chuck 190 according to the Reference Example, the diameter of the recess 39 provided in the ceramic dielectric substrate 11 is 1 mmφ, the curvature radius of the curved surface 39a is 0.2 mm and the thickness D1 is 0.3 mm.

FIG. 9 shows simulation results from a simulation of the maximum stress with the distance D3 in the electrostatic chuck 110 according to the embodiment and the electrostatic chuck 190 according to the Reference Example. Here, it was assumed that the ceramic dielectric substrate 11 with a diameter of 4 mm was rotated around an axis O at the center of the recesses 30 and 39, the Young's modulus of the ceramic dielectric substrate 11 was 400 GPa and the Poisson's ratio was 0.24. Stresses generated in the ceramic dielectric substrate 11 when a pressure of 1 atmosphere is applied to the recesses 30 and 39 were calculated. From the simulation results, it was seen that the maximum stress in the electrostatic chuck 110 according to the embodiment was from 0.28 to 0.36 of that in the electrostatic chuck 190. In other words, with the curved surface 30a provided at the tip end side of the recess 30, strength can be increased for recesses of the same depth in comparison to the Reference Example.

Next, a manufacturing method of the electrostatic chuck 110 according to the embodiment will be explained.

Figure 10A:
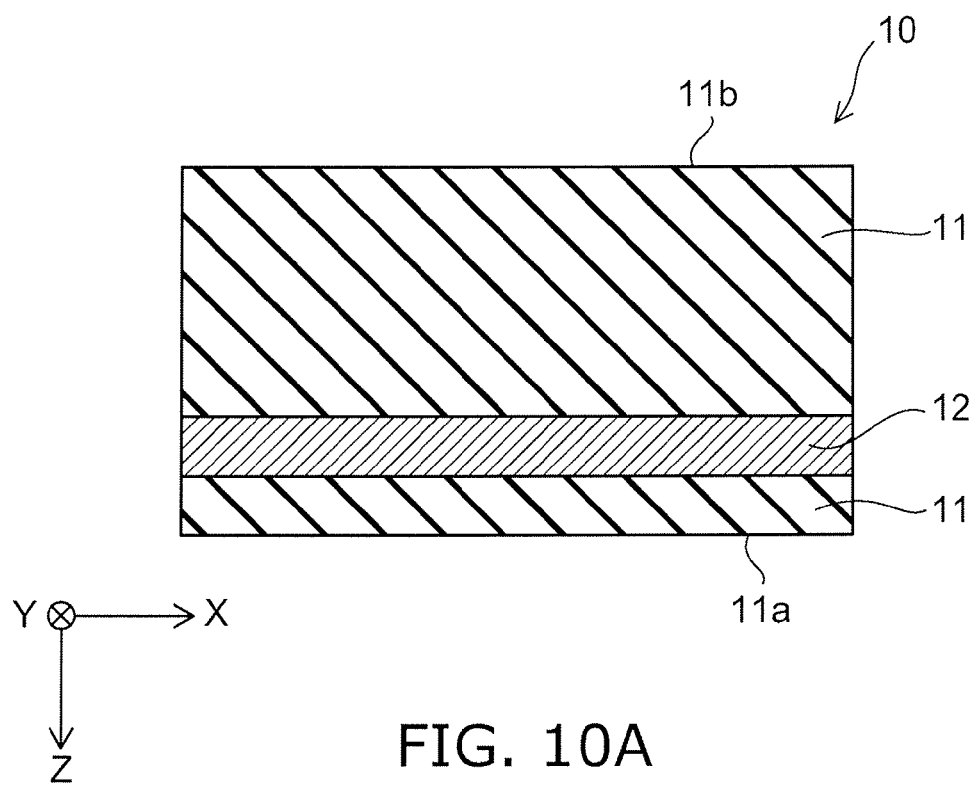
FIGS. 10A to 12B are schematic cross-sectional views for explaining processes of the manufacturing method of the electrostatic chuck according to the embodiment.
Figure 11A:
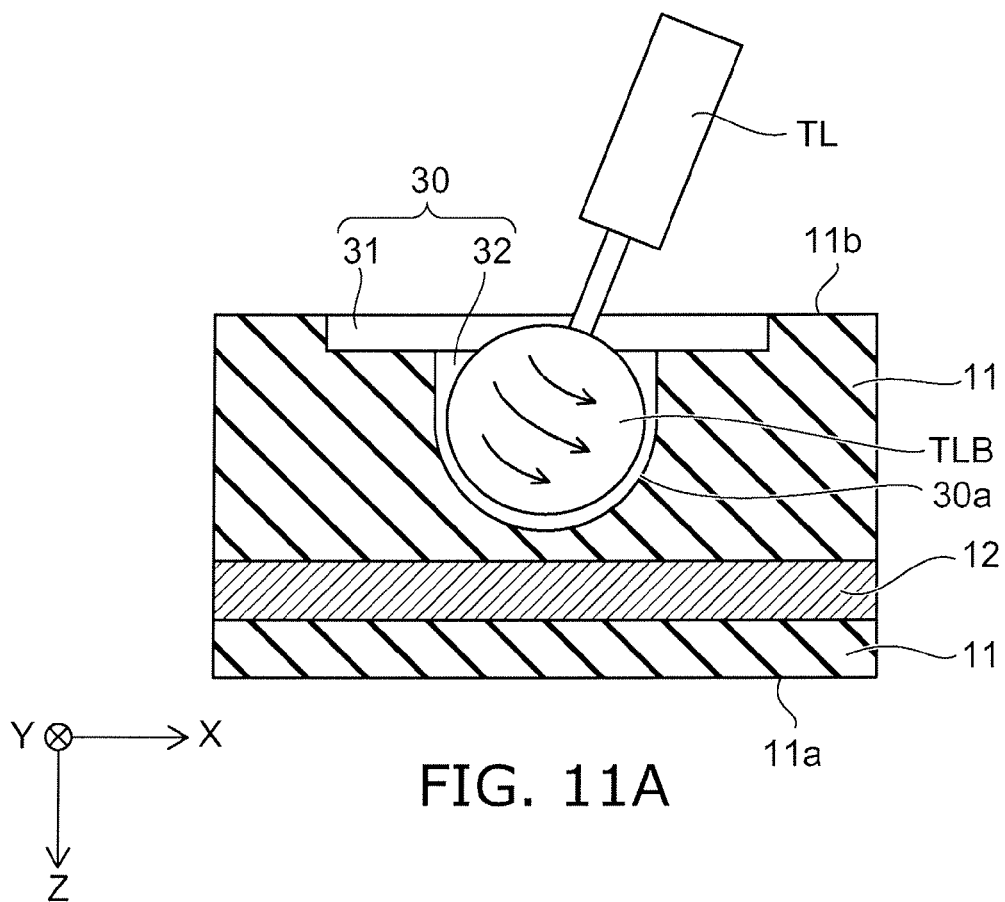
Figure 11B:
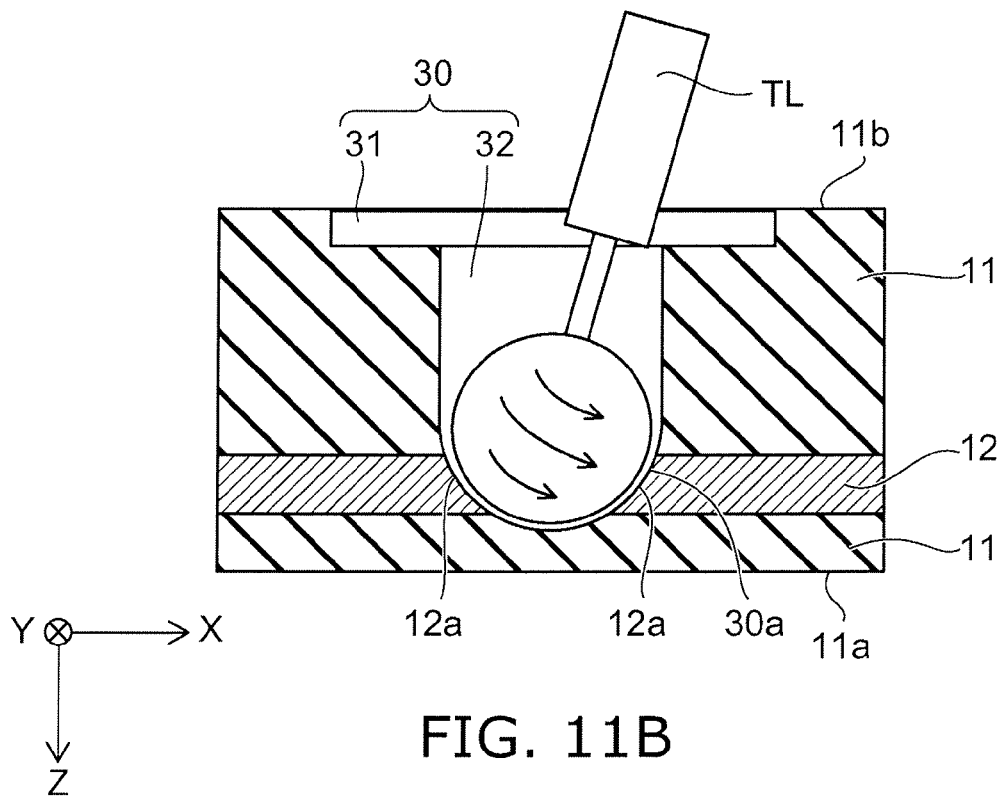
Figure 12A:
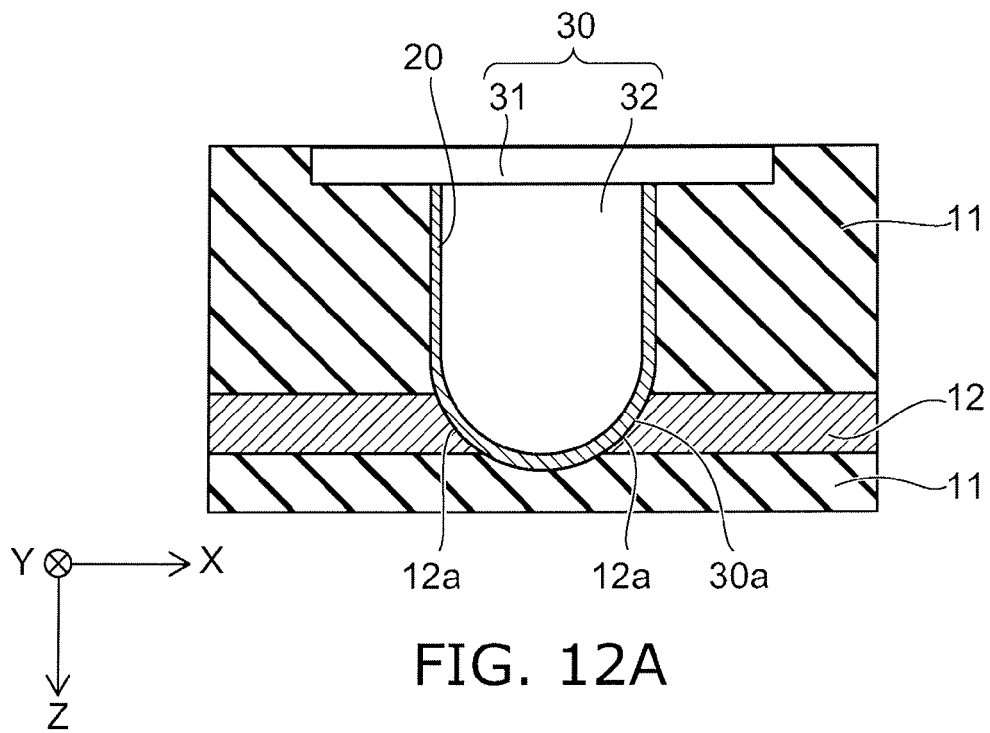
Figure 12B:
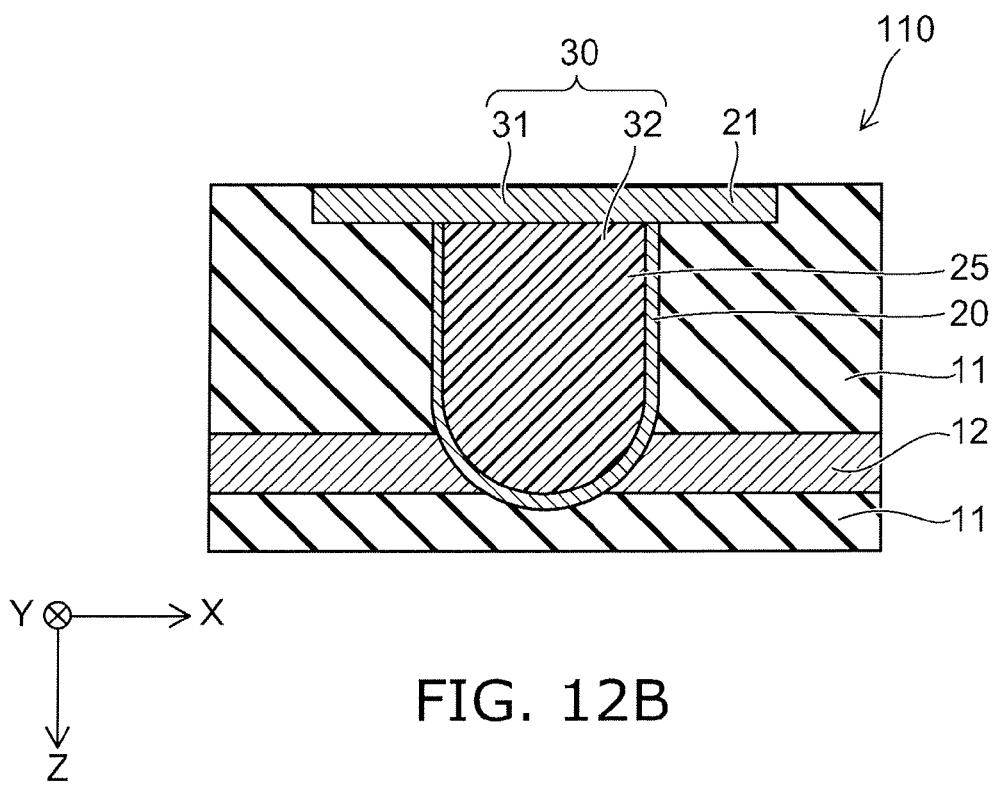

FIGS. 10 to 12 are schematic cross-sectional views for explaining processes of the manufacturing method of the electrostatic chuck according to the embodiment.

Note that FIGS. 10 to 12 are magnified schematic cross-sectional views focusing on the recess 30.

First, as illustrated in FIG. 10, a stacked structural body 10 having the electrode 12 provided between the first major surface 11a and the second major surface 11b of the ceramic dielectric substrate 11 is formed.

To form the stacked structural body 10 a green sheet of the ceramic dielectric substrate is first formed. For example, the green sheet may be formed by adding a binder to alumina powder, mixing and milling in a ball mill, and then mixing and removing air bubbles. For the alumina powder, for example, a powder with an average particle diameter not higher than 0.5 μm and a purity not lower than 99.99 percent (%) may be used. Assistant and the like other than alumina may be added. A thickness of the green sheet is, for example, not lower than 0.4 mm and not higher than 1.0 mm.

Next, a metalized paste for forming the electrode 12 is formed. For the metalized paste, a predetermined quantity of palladium powder is mixed into alumina power, a binder or the like is added, and the ingredients are mixed to create a slurry-form palladium paste. Here, to increase bindability of the metalized paste at sintering, the alumina power may be mixed into the palladium powder.

Next, the metalized paste is screen printed on the green sheet using a screen printing method to form a pattern of the electrode 12. Next, a number of layers required for a post-sintering size is stacked by position matching layers above and below the green sheet having the pattern of the electrode 12 formed thereon. The arrangement then undergoes thermocompression bonding to form a laminated sheet.

Next, the laminated sheet is cut to a predetermined form (such as a circular form). The cut sheet is then sintered at not lower than 1350° C. and not higher than 1600° C. Here, the electrode 12 is sintered simultaneously. The sintering may be performed in air or another reductive atmosphere. After the sintering, further HIP processing may be performed.

Accordingly, the stacked structural body 10 having the electrode 12 provided between the first major surface 11a and the second major surface 11b of the ceramic dielectric substrate 11 is formed.

Figure 10B:
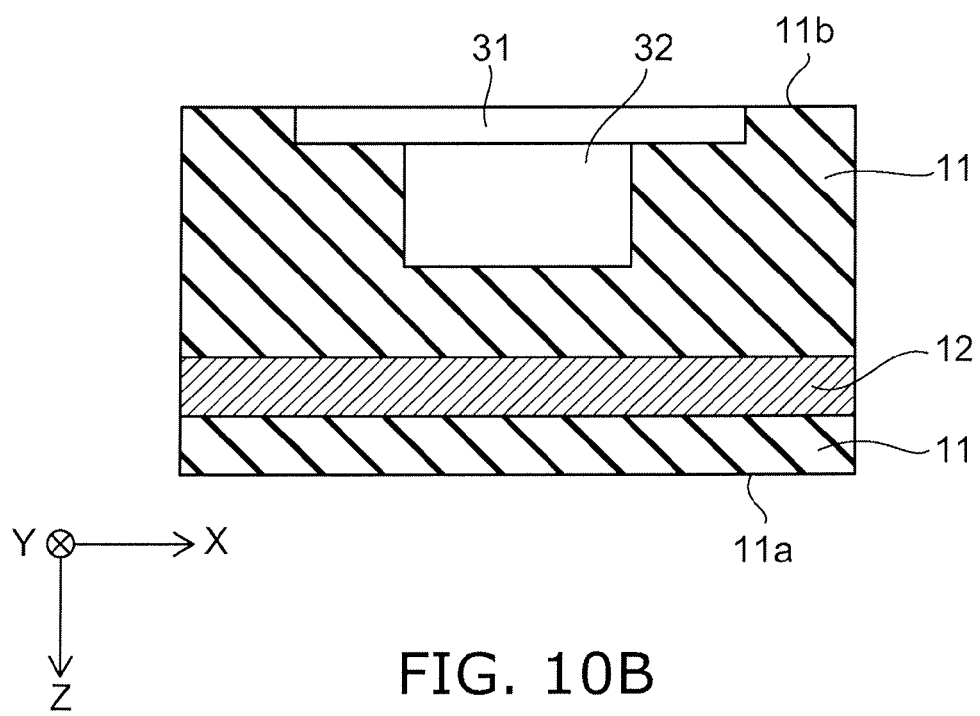

Next, as illustrated in FIG. 10B, a counterbore is formed in the second major surface 11b of the ceramic dielectric substrate 11 using a drill or the like. For the counterbore, a first portion 31 and a second portion 32 positioned at a bottom of the first portion 31 and having a narrower opening than the first portion 31 are formed. Note that the counterbore may be the second portion 32 alone. The second portion 32 is formed from the second major surface 11b of the ceramic dielectric substrate 11 to a short distance in front of the electrode 12.

Next, as illustrated in FIGS. 11A and 11B, a bottom of the second portion 32 is cut away to form the recess 30 having the curved surface 30a. For the cutting, a rotating-type cutting tool TL provided with a spherical bit TLP at a tip end is used. By cutting with the spherical bit TLB, the spherical curved surface 30a is formed at the tip end of the recess 30. Here, an axis of rotation of the bit TLB of the cutting tool TL should be inclined with respect to an axis (Z axis) in the cutting direction (Z direction) of the recess 30. The tip end of the recess 30 can then be efficiently formed by the rotating bit TLB.

The cutting with the cutting tool TL is performed until the curved surface 30a of the recess 30 reaches the electrode 12. Accordingly, as illustrated in FIG. 11, a portion of the electrode 12 is exposed at the curved surface 30a of the recess 30 (exposed portion 12a).

Next, as illustrated in FIG. 12A, the conductive member 20 is formed on the internal wall of the recess 30. For the conductive member 20, a platinum paste may, for example, be used. Specifically, the platinum paste is coated so as to contact the exposed portion 12a of the curved surface 30a which is at least a portion of the internal wall of the recess 30. Thereafter, by sintering at temperature of approximately 900° C., the conductive member 20 connected to the exposed portion 12a is formed.

Note that, besides using the platinum paste, the conductive member 20 may be provided by plating, Chemical Vapor Deposition (CVD) or by an organic resin or the like including conductive particles.

Next, as illustrated in FIG. 12, the conductive resin 25 or the like is embedded in the recess 30, and the pad 21 is attached to the first portion 31 of the recess 30 via the conductive resin 25. Note that although here the conductive resin 25 is embedded in the recess 30 and the pad 21 is attached thereto, the constituents can be configured to a configuration required for the form of conduction with the electrode 12. Also, braze or solder may be used instead of the conductive resin 25.

This completes the electrostatic chuck 110 of the embodiment.

The following describes the forming of the recess 30.

FIGS. 13 to 18 are schematic views for explaining relationships between the depth of the recess and a state of the opening when viewed in the Z direction.

In each figure, A is a plan view of the recess, looking along the Z direction and B is cross-sectional view of the recess. The recess deepens progressively from FIGS. 13A to FIG. 18B.

Figure 13A:
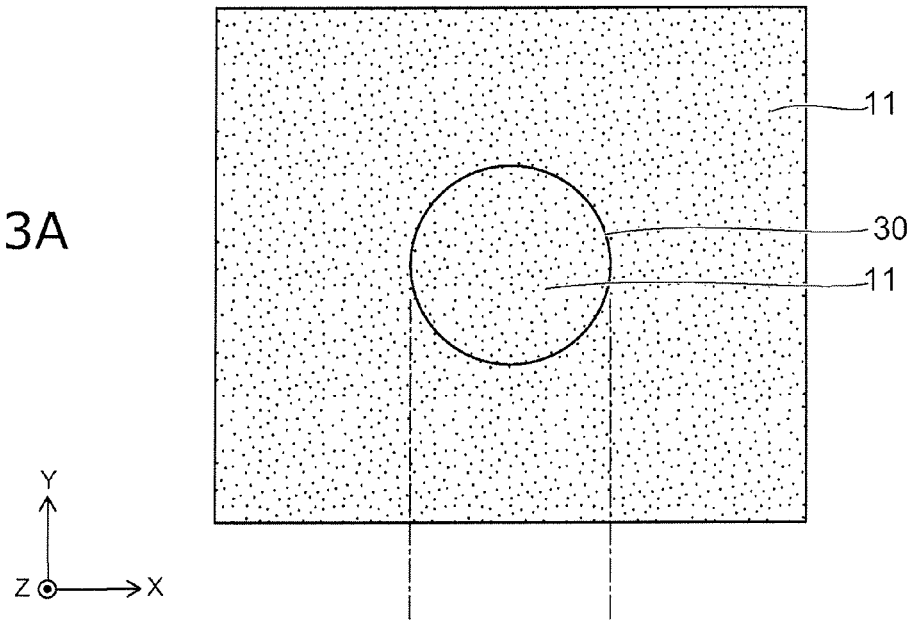
FIGS. 13A to 18B are schematic views for explaining relationships between the depth of the recess and a state of the opening when viewed in the Z direction.
Figure 13B:
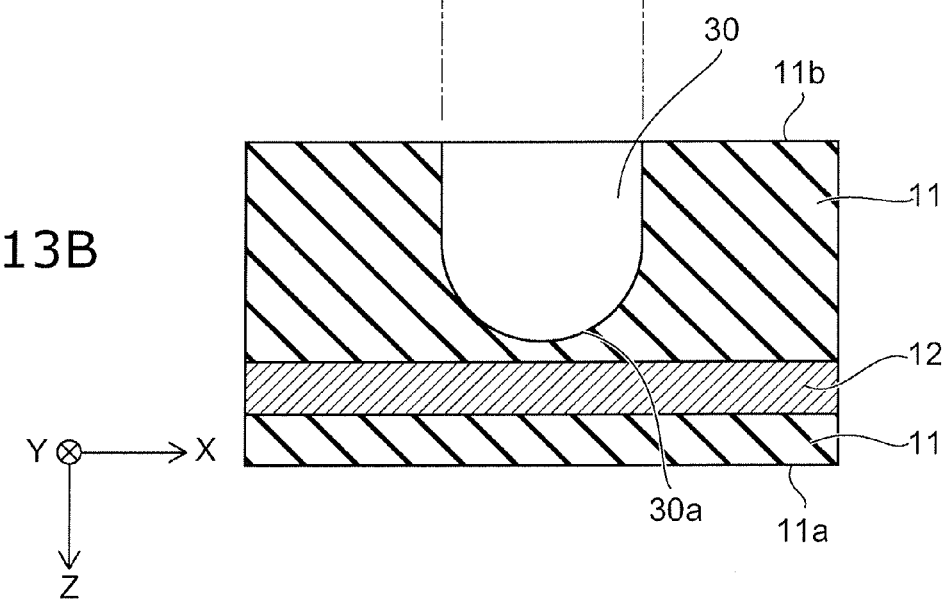

First, as illustrated in FIGS. 13A and 13B in the Z-direction view of the recess 30, when the recess 30 has not yet reached the electrode 12, only the ceramic dielectric substrate 11 appears within the diameter 2R of the recess 30.

Figure 14A:
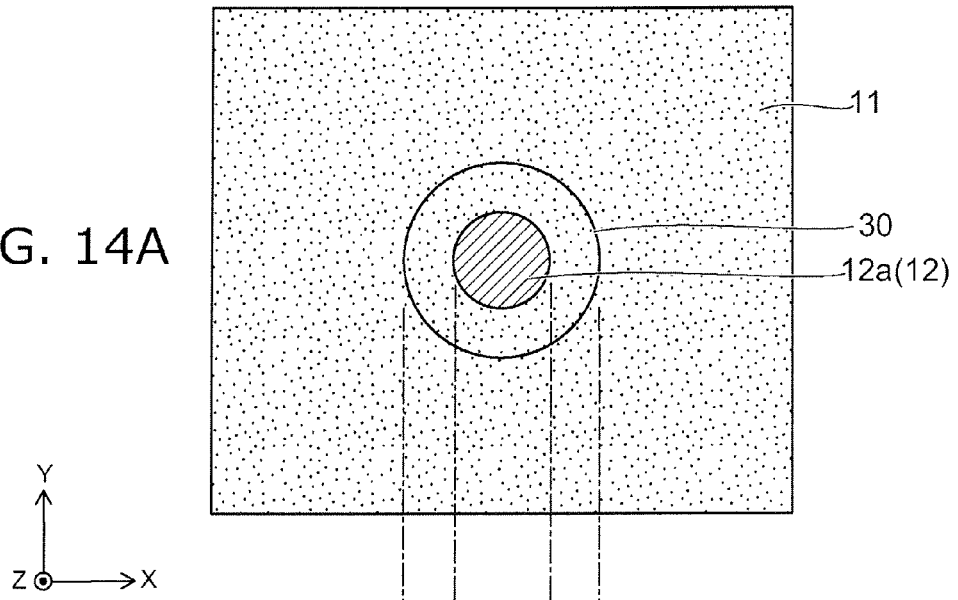
Figure 14B:
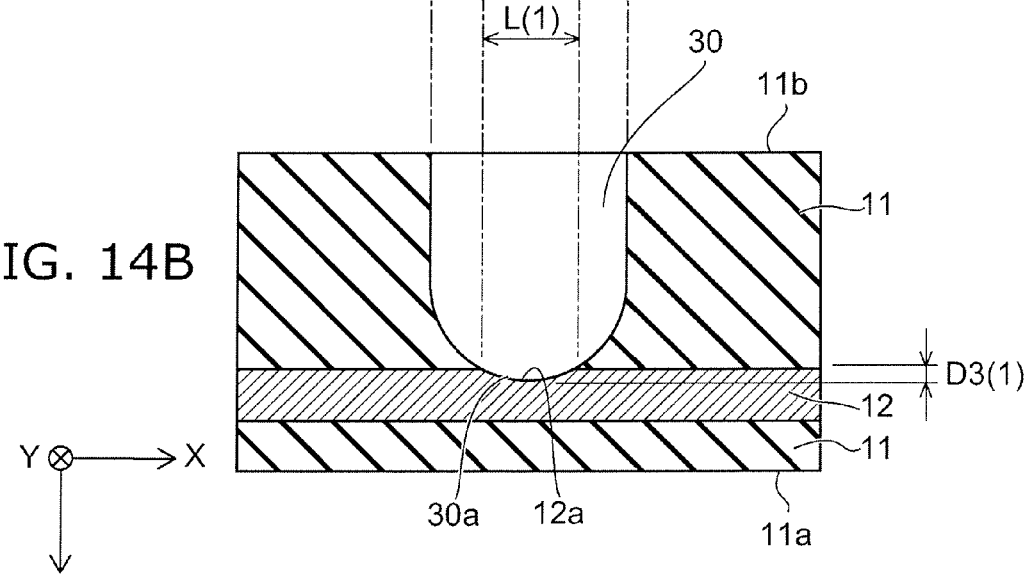

Next, as illustrated in FIGS. 14A and 14B in the Z-direction view of the recess 30, when the recess 30 has reached the electrode 12 and the tip end of the recess 30 is within the electrode 12 (distance D3(1)), the exposed portion 12a of the electrode 12 appears as a circle within the diameter 2R of the recess 30. In the case of the distance D3(1) for the recess 30, the diameter of the circlar form of the exposed portion 12a is L(1).

Figure 15A:
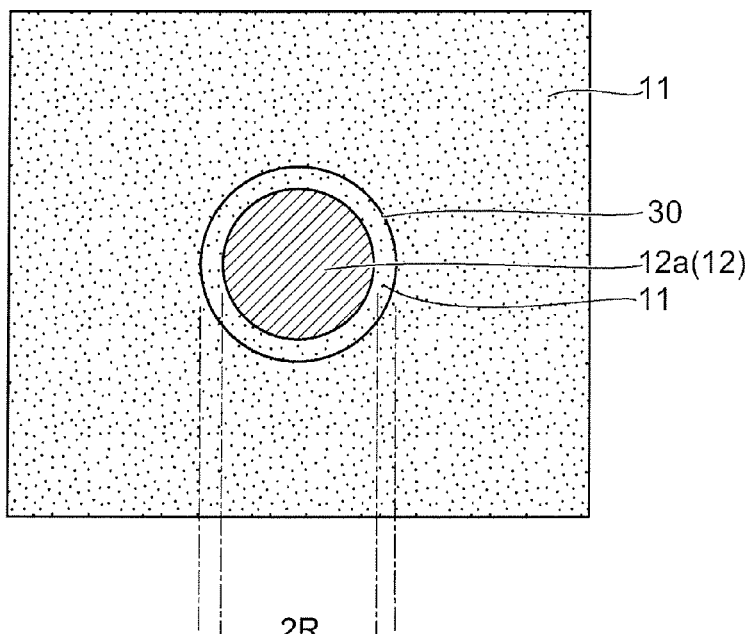
Figure 15B:
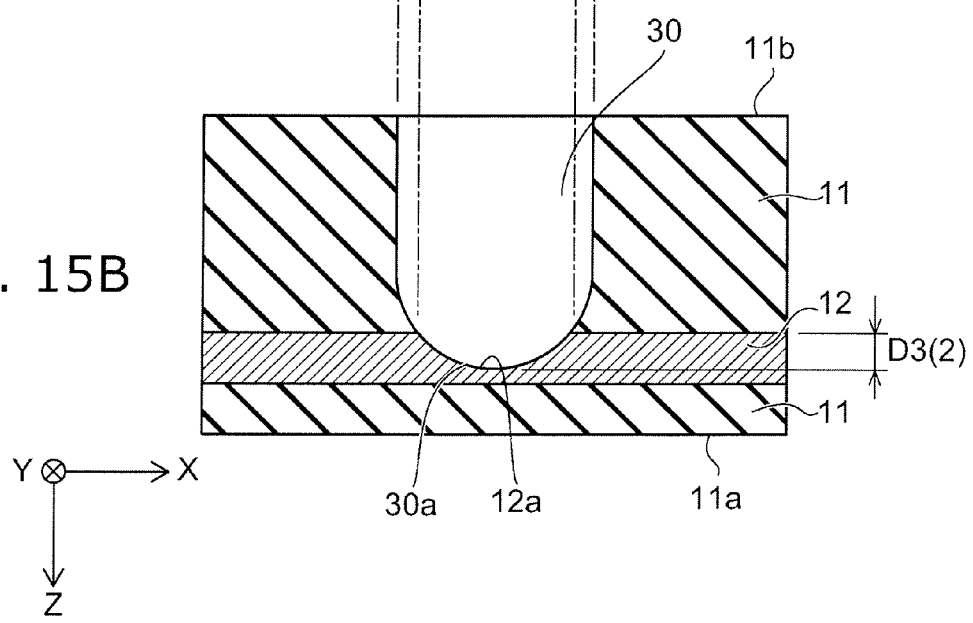

Next, as illustrated in FIGS. 15A and 15B in the Z-direction view of the recess 30, when the tip end of the recess 30 has reached deeper than illustrated in FIG. 14B within the electrode 12 (distance D3(2)), a diameter L(2) of the circular form of the exposed portion 12a appearing within the diameter 2R of the recess 30 is larger than the diameter L(1) illustrated in FIG. 14A.

Figure 16A:
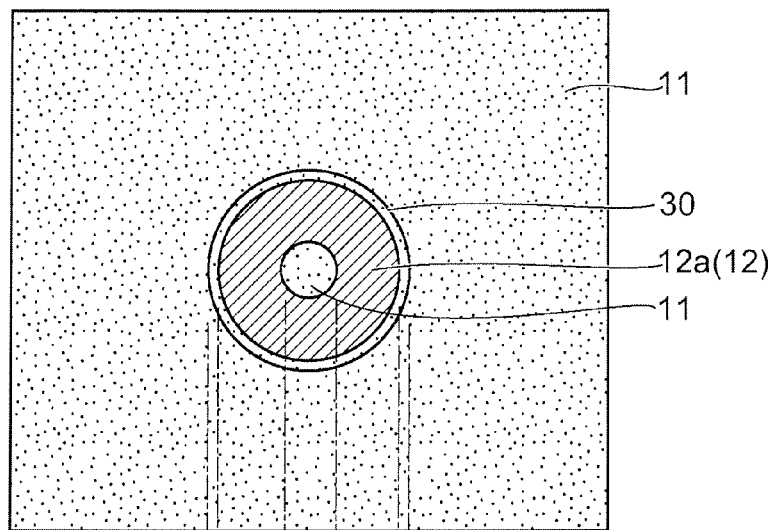
Figure 16A:
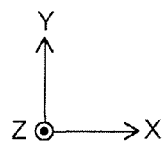
Figure 16B:
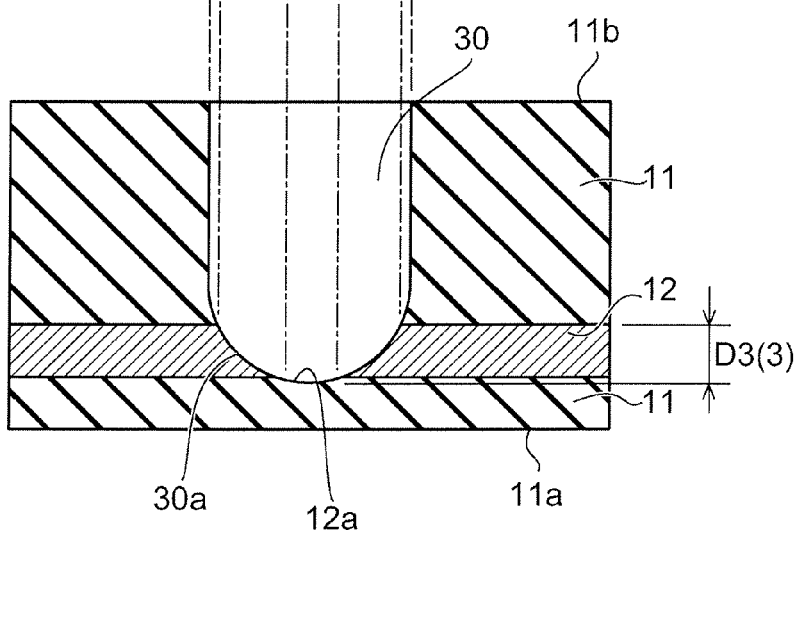

Next, as illustrated in FIGS. 16A and 16B in the Z-direction view of the recess 30, when the tip end of the recess 30 has just pierced through the electrode 12 (distance D3 (3)), a diameter L(3) of the circular form of the exposed portion 12a appearing within the diameter 2R of the recess 30 is larger than the diameter L(2) illustrated in FIG. 15A. Further, as the tip end portion of the recess 30 has pierced through the electrode 12, the ceramic dielectric substrate 11 at a central portion of the exposed portion 12a appears as a circle form (diameter M(1)). In other words, when viewed from the Z direction, the exposed portion 12a appears as a ring form.

Figure 17A:
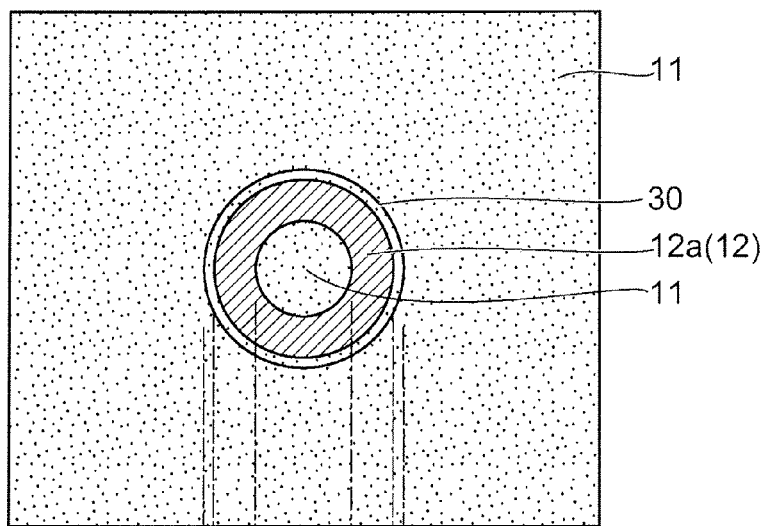
Figure 17A:
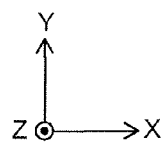
Figure 17B:
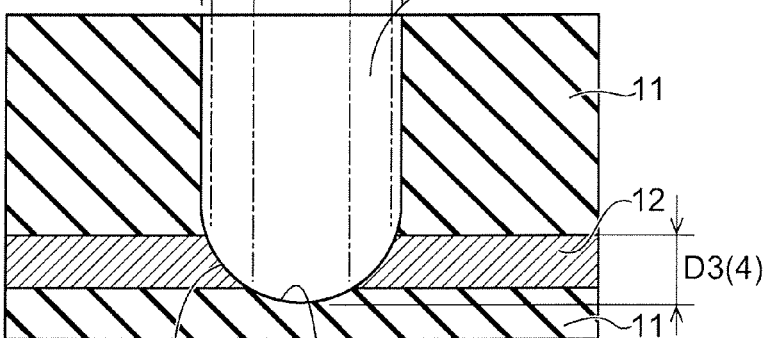
Figure 17B:
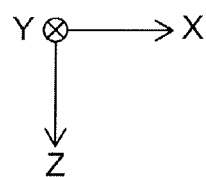

Next, as illustrated in FIGS. 17A and 17B in the Z-direction view of the recess 30, when the tip end of the recess 13 has reached deeper than illustrated in FIG. 16B (distance D3(4)), a diameter L(4) of the circular form of the exposed portion 12a appearing within the diameter 2R of the recess 30 is larger than the diameter L(3) illustrated in FIG. 16A. Further, a diameter M(2) of the circular form of the ceramic dielectric substrate 11 appearing in the central portion of the exposed portion 12a is larger than the diameter M(1) illustrated in FIG. 16A.

Figure 18A:
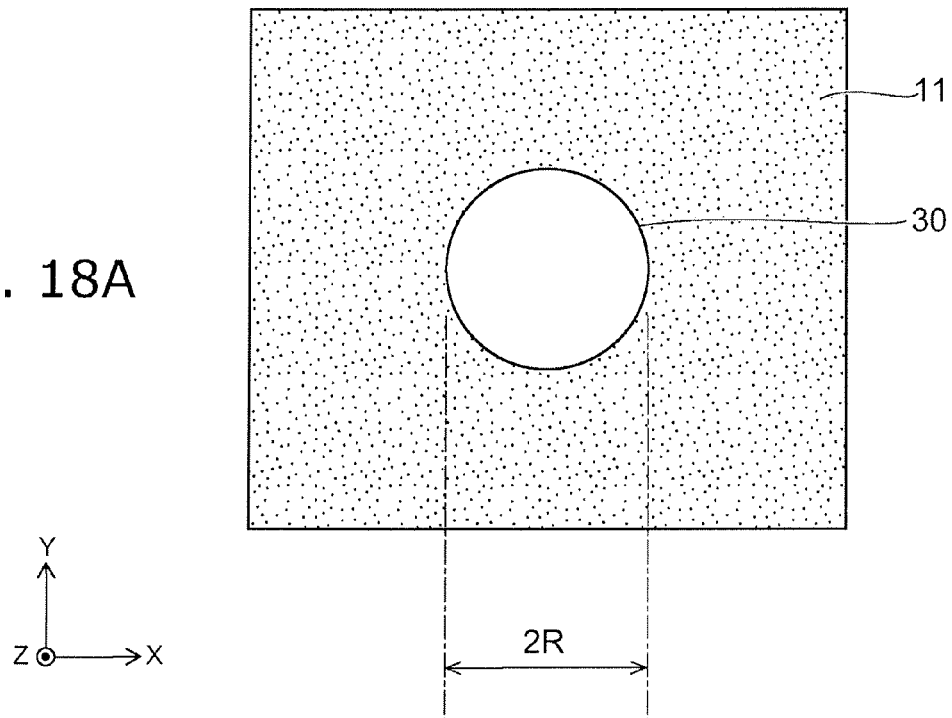
Figure 18B:
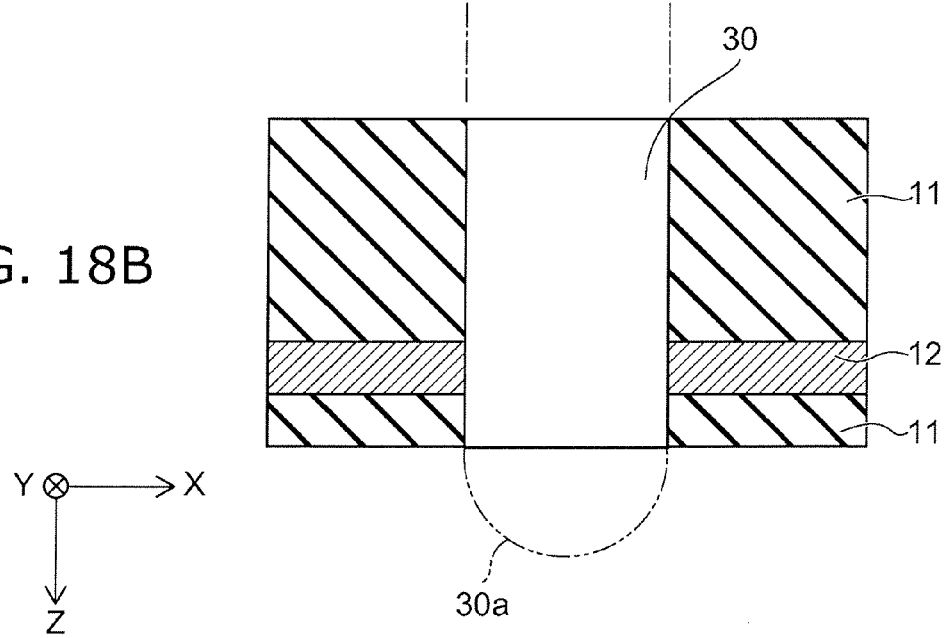

Next, as illustrated in FIGS. 18A and 18B in the Z-direction view of the recess 30, when the tip end of the recess 30 has fully pierced through the electrode 12, which is to say when the curved surface 30a is located beyond the electrode 12, the recess 30 with diameter 2R appears.

Thus, the state of the recess 30 in the Z-direction view changes according to the depth (distance D3) of the recess 30 illustrated in FIGS. 13 to 18. Accordingly, by controlling the state of the recess 30 when viewed in the Z direction, which is to say at least one of the diameter L and the diameter M, when forming the recess 30, the distance D3 can be accurately set.

For example, the recess 30 may be deepened gradually while confirming the state of the inside of the recess 30 through observation with a microscope. When the inside of the recess 30 is observed and the entire inside of the recess 30 is the ceramic dielectric substrate 11 as illustrated in FIG. 13A, it can be judged that the tip end of the recess 30 has not yet reached the electrode 12.

Then, when the exposed portion 12a has appeared as a circular form within the recess 30 as illustrated in FIG. 14A, it can be judged that the tip end of the recess 30 has reached the electrode 12. Here, if the diameter L of the circular form of the exposed portion 12a is measured, the depth (distance D3) of the tip end of the recess 30 can be calculated using the above-described (Formula 1).

When the exposed portion 12a has appeared as a circular form within the recess 30 and the ceramic dielectric substrate 11 has appeared as a circular form in a center portion of the exposed portion 12a as illustrated in FIG. 16A, it can be judged that the tip end of the recess 30 has pierced through the electrode 12. Even when the tip end of the recess 30 has pierced through the electrode 12, the curved surface 30a and the electrode 12 continue to be in a state of intersection while the exposed portion 12a appears in a ring form. When the exposed portion 12a has appeared in a ring form, the distance D3 can be calculated using the diameter L of the exposed portion 12a. In addition, the distance D3 can also be calculated using the diameter M of the ceramic dielectric substrate 11 that has appeared in the center portion of the exposed portion 12a by, for example, the Formula 2 below.

$$D3 = t + R - \frac{1}{3} \times \sqrt{(4 \times R^2 - M^2)}$$ (Formula 2)

In the embodiment, the recess 30 continues to be cut from when the exposed portion 12a appears as a circular form within the recess 30 (see FIG. 13A) to a state immediately before the ring form of the exposed portion 12a disappears (see FIG. 16A to 17A). Accordingly, it is possible to suppress deep boring of the recess 30 and reliably expose the electrode 12 at the curved surface 30a.

Figure 19A:
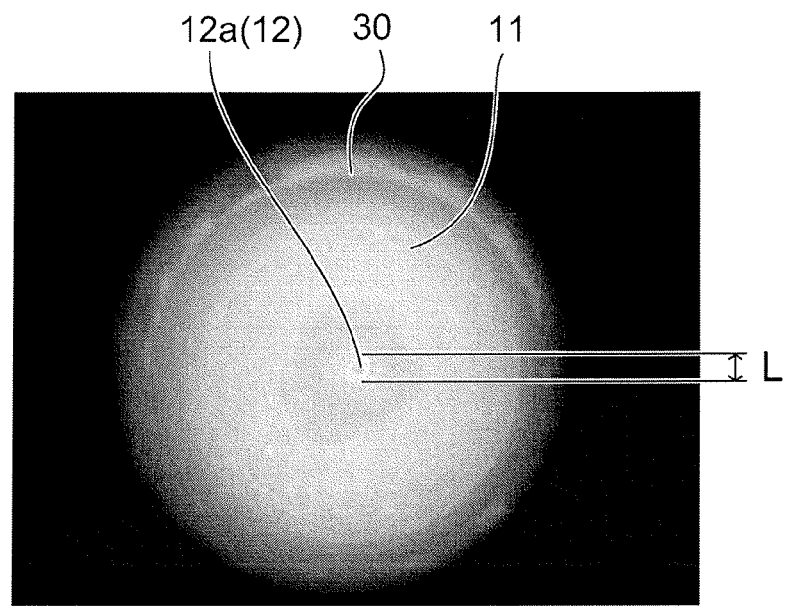
FIGS. 19A and 19B show states of the recess.
Figure 19A:
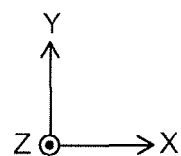
Figure 19B:
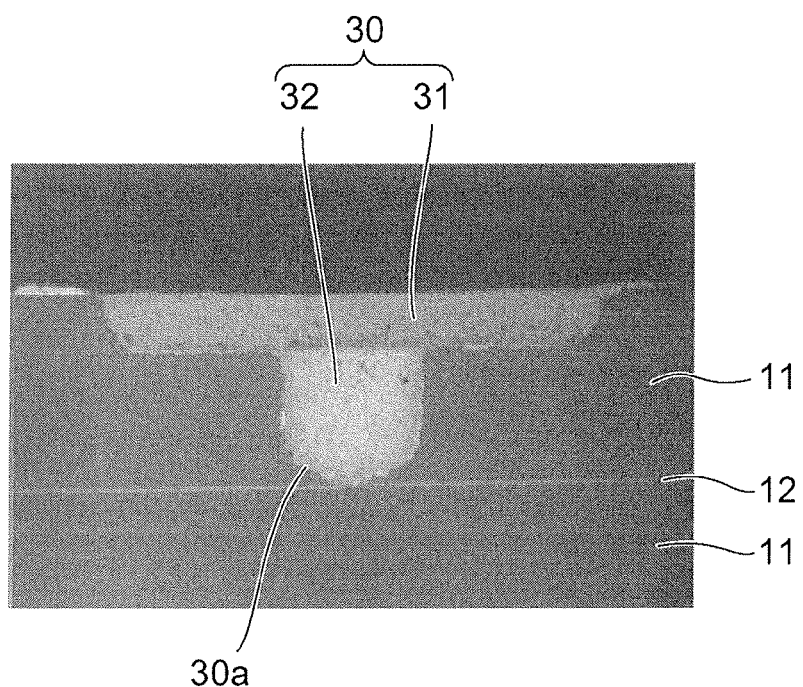
Figure 19B:
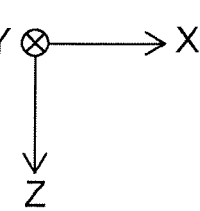

FIGS. 19A and 19B show states of the recess.

FIG. 19A is an optical microscope photograph showing a state within the recess 30. FIG. 19B is an electron microscope photograph showing a cross-section of the recess 30. The magnification factor differs in FIG. 19A and 19B but the depth of the recess 30 is the same.

As shown in FIG. 19A, a portion that, for example, appears as white in the ring form within the recess 30 is the exposed portion 12a of the electrode 12. Here, if the diameter L of the exposed portion 12a is measured, the distance D3, which corresponds to the depth of the recess 30, can be controlled.

In the recess 30 shown in FIG. 19B, the second portion 32 is provided at the bottom of the first portion 31. In the recess 30, the curved surface 30a of the tip end provided in the second portion 32 contacts the electrode 12. Thus, by controlling the diameter L of the exposed portion 12a, deep boring of the recess 30 is suppressed and the electrode 12 is exposed at the curved surface 30a (exposed portion 12a) of the recess 30, thereby enabling reliable electrical conduction with the conductive member 20 to be obtained.

Further, by satisfying the above-described condition (3), the change in the distance D3 of the recess 30 with respect to the change in the diameter L of the exposed portion 12a can be reduced. Thus, when cutting the recess 30, the amount of increase in the diameter L of the exposed portion 12a is small compared to the amount of increase in the distance D3 of the recess 30, and it is therefore possible to adjust the microscopic distance D3 accurately while referring to the diameter L.

Next, other embodiments of the recess 30 are described.

FIGS. 20A to 20H are schematic cross-sectional views of another embodiment of the recess.

Figure 20A:
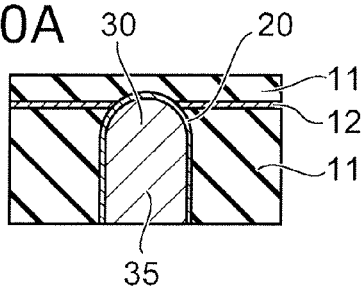
FIGS. 20A to 20H are schematic cross-sectional views of another embodiment of the recess.
Figure 20B:
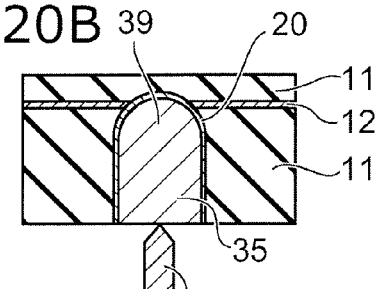

In the embodiment illustrated in FIGS. 20A and 20B, a metal member 35 is inserted into the recess 30. For the metal member 35, a material with a linear expansion coefficient close to that of the ceramic dielectric substrate 11, such as molybdenum, cobalt or an alloy of these is used. The metal member 35 is inserted via the conductive member 20 within the recess 30. Accordingly, the electrical conduction between an external portion and the electrode 12 is obtained by causing the contact electrode 61 to contact the metal member 35.

Figure 20C:
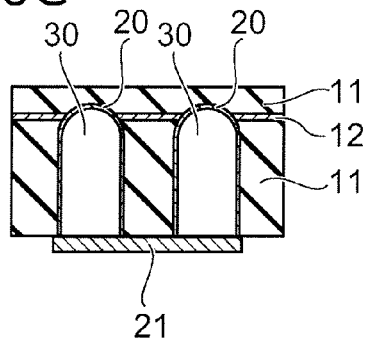
Figure 20D:
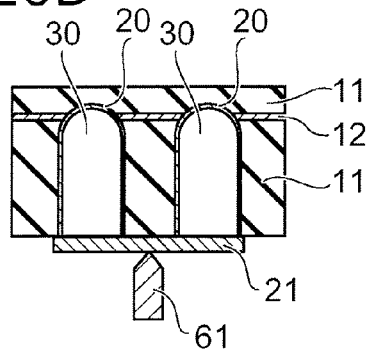

In the embodiment illustrated in FIGS. 20C and 20D, a plurality of recesses 30 is formed for a single pad 21. The single pad 21 is formed across the plurality of recesses 30. In the embodiment illustrated in FIGS. 20C and 20D, two recesses 30 are formed for each pad 21. Accordingly, when the contact electrode 61 is caused to contact the pad 21, reliable electrical conduction with the electrode 12 can be obtained via the conductive member 20 provided in each of the plurality of recesses 30.

Figure 20E:
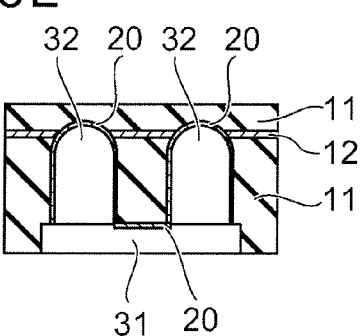
Figure 20F:
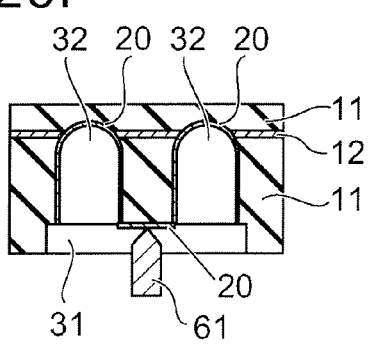

In the embodiment illustrated in FIGS. 20E and 20F, a plurality of second portions 32 is formed for a single first portion 31. Specifically, the plurality of second portions 32 is formed at the bottom of the first portion 31. In the embodiment illustrated in FIGS. 20E and 20F, two second portions 32 are formed for the single first portion 31. The conductive member 20 extends from the internal walls of each of the second portions 32 to the bottom of the first portion 31. The contact electrode 61 contacts the bottom of the first portion 31 where the conductive member 20 extends, thereby obtaining an electrical conduction with the electrode 12.

Figure 20G:
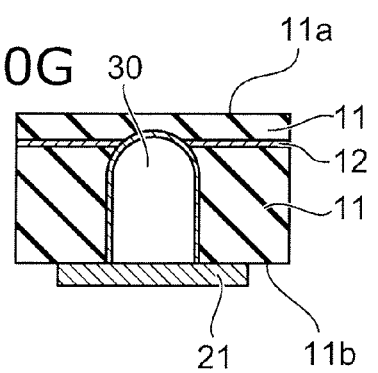
Figure 20H:
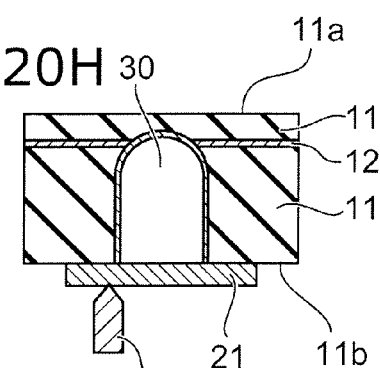

In the embodiment illustrated in FIGS. 20G and 20H, the pad 21 is formed on the second major surface of the ceramic dielectric substrate 11, and the pad 21 and the conductive member 20 provided in the recess 30 are in contact. Accordingly, when the contact electrode 61 is caused to contact the pad 21, electrical conduction with the electrode 12 can be obtained.

Next a further example of the curved surface of the recess is described.

Figure 21A:
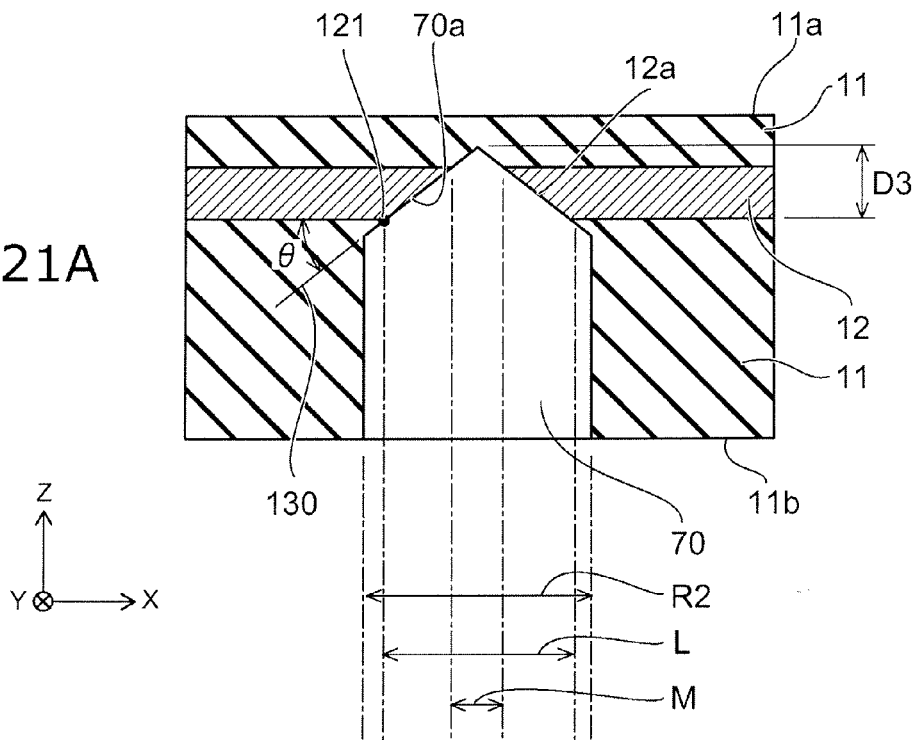
FIGS. 21A and 21B are schematic views for explaining a recess having a conical curved surface.
Figure 21B:
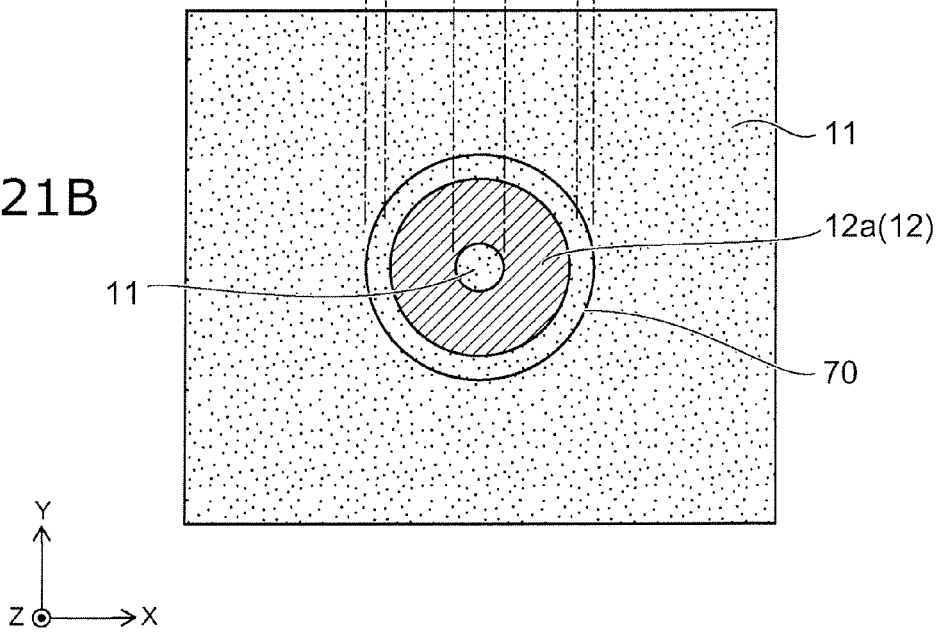

FIGS. 21A and 21B are schematic views for explaining a recess having a conical curved surface. While the above-described curved surface 30a of the recess 30 was spherical, a curved surface 70a of a recess 70 illustrated in FIG. 21 is conical. To form the recess 70 of this type, a bit TLB with a conical form is provided at the tip end of the cutting tool TL illustrated in FIGS. 11A and 11B, and the cutting tool TL is caused to proceed in the Z direction. Accordingly, the conical curved surface 70a is formed at the tip end of the recess 70.

In the embodiment, the electrode 12 is exposed at the conical curved surface 70a. A state within the recess 70 illustrated in FIGS. 21A and 21B changes according to the distance D3, which corresponds to the depth of the recess 70. The change of the state is similar to that illustrated in FIGS. 13 to 18.

In the cross-sectional form of the curved surface 70a viewed in the Y direction, an angle A between a tangent 130 at the position 121 of the exposed portion 12a of the electrode 12 closest to the second major surface 11b side and the second major surface 11b side of the electrode 12 is preferably less than 45°. As a result, the amount of the change in the distance D3 of the recess 30 with respect to the amount of the change in the diameter L of the exposed portion 12a can be reduced. Thus, when cutting the recess 30, the amount of increase in the diameter L of the exposed portion 12a can be small compared to the amount of increase in the distance D3 of the recess 30, and it is therefore possible to adjust the microscopic distance D3 of the recess 30 accurately while referring to the diameter L.

Figure 22A:
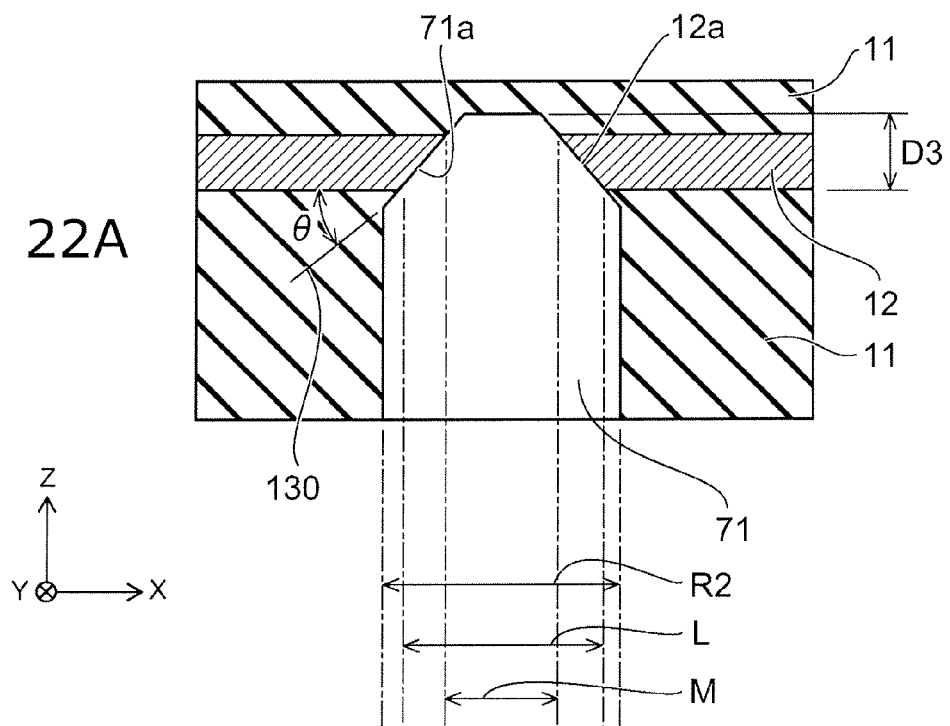
FIGS. 22A and 22B are schematic views for explaining a recess having a conic-section curved surface.
Figure 22B:
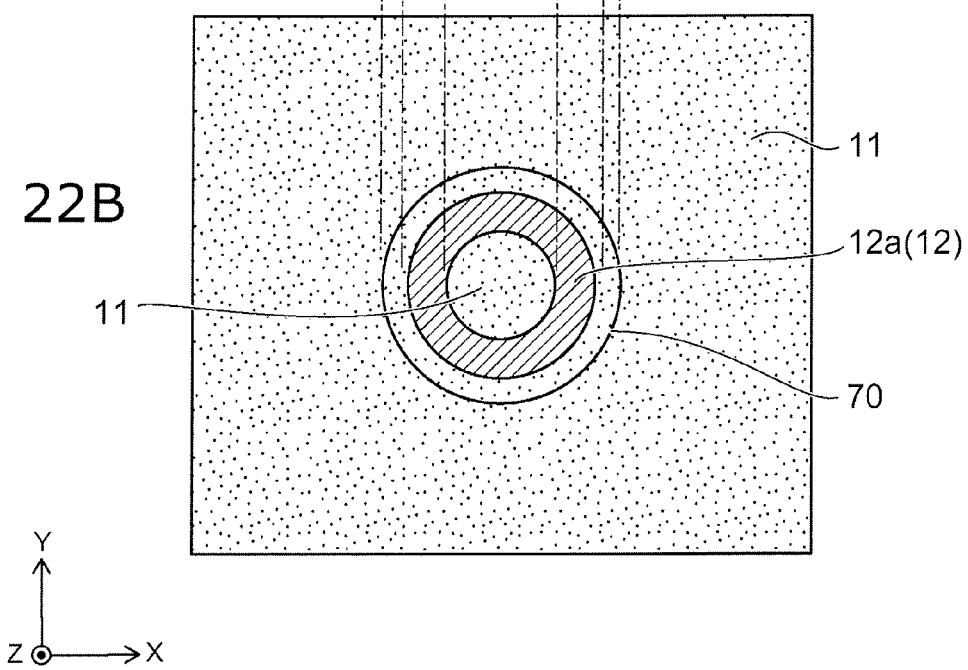

FIGS. 22A and 22B are schematic views for explaining a recess having a conic-section curved surface. The curved surface 71a of the recess 71 illustrated in FIG. 22 has a conic-section form. To form the recess 71 of this type, a bit TLB with a conic-section form is provided at the tip end of the cutting tool TL illustrated in FIGS. 11A and 11B, and the cutting tool TL is caused to proceed in the Z direction. Accordingly, the conic-section curved surface 71a is formed at the tip end of the recess 71.

In the embodiment, the electrode 12 is exposed at the conic-section curved surface 71a. A state within the recess 71 illustrated in FIG. 22B changes according to the distance D3, which corresponds to the depth of the recess 71. The change of the state is similar to that illustrated in FIGS. 13 to 18.

In the cross-sectional form of the curved surface 71a viewed in the Y direction, an angle A between a tangent 130 at the position 121 of the exposed portion 12a of the electrode 12 closest to the second major surface 11b side and the second major surface 11b side of the electrode 12 is preferably less than 45°. As a result, the change in the distance D3 of the recess 30 with respect to the change in the diameter L of the exposed portion 12a can be reduced. Thus, when cutting the recess 30, the amount of increase in the diameter L of the exposed portion 12a can be small compared to the amount of increase in the distance D3 of the recess 30, and it is therefore possible to adjust the microscopic distance D3 of the recess 30 accurately while referring to the diameter L.

As described above, according to the embodiment, conduction to the internal electrode 12 of the ceramic dielectric substrate 11 can be reliably secured, and reductions in the mechanical strength of the ceramic dielectric substrate 11, and in the reliability of the electrical insulation of the ceramic dielectric substrate 11 caused by boring the recess 30 can be minimized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An electrostatic chuck comprising:
    a ceramic dielectric substrate having a first major surface on which a material to be adsorbed is to be mounted and a second major surface on a side opposite the first major surface;
    an electrode interposed between the first major surface and the second major surface of the ceramic dielectric substrate; and
    a conductive member provided in a recess formed in the second major surface of the ceramic dielectric substrate,
    a central portion of a tip end of the recess being semisperical surface, the electrode having an exposed portion the exposed portion being exposed along a curved surface of a part of the semispherical surface,
    the conductive member contacting the electrode at the exposed portion, wherein
    if the exposed portion has a diameter of L when viewed along a first direction going from the second major surface toward the first major surface and a curvature radius of the curved surface is R, $L \leq 2R$.

2. The electrostatic chuck according to claim 1, wherein if the exposed portion has diameter of L when viewed along a first direction going from the second major surface toward the first major surface, and a distance in the first direction between a second major surface side of the exposed portion and a tip end of the recess is D3, $D3 \leq L/2$.

3. The electrostatic chuck according to claim 1, wherein the curved surface is spherical, and if a curvature radius of the curved surface is R, and a gap in a first direction going from the second major surface toward the first major surface between a second major surface side of the exposed portion and a tip end of the recess is D3, $D3 \leq R-(R/\sqrt{2})$.

4. The electrostatic chuck according to claim 1, wherein a direction perpendicular to a first direction going from the second major surface toward the first major surface is a second direction, and a direction perpendicular to the first direction and the second direction is a third direction, and when, in a cross-section of the recess viewed along the second direction, an angle, with respect to the third direction, of a tangent to the curved surface at a contact point between a profile line of the curved surface and the exposed portion is θ, $\theta < 45°$.

5. The electrostatic chuck according to claim 1, wherein the recess includes a first portion provided on the second major surface side, and a second portion provided between the first portion and the electrode and having an opening smaller than the first portion.

6. The electrostatic chuck according to claim 5, wherein the recess includes a plurality of the second portions between the first portion and the electrode.

* * * * *